(12) United States Patent
Chen et al.

(10) Patent No.: US 8,735,226 B2
(45) Date of Patent: *May 27, 2014

(54) METHODS AND DEVICES FOR FORMING NANOSTRUCTURE MONOLAYERS AND DEVICES INCLUDING SUCH MONOLAYERS

(71) Applicant: SanDisk 3D LLC, Milpitas, CA (US)

(72) Inventors: Jian Chen, Mountain View, CA (US); Karen Chu Cruden, Pleasanton, CA (US); Xiangfeng Duan, Mountain View, CA (US); Chao Liu, San Jose, CA (US); J. Wallace Parce, Palo Alto, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/956,483

(22) Filed: Aug. 1, 2013

(65) Prior Publication Data
US 2013/0337642 A1 Dec. 19, 2013

Related U.S. Application Data

(60) Continuation of application No. 12/803,568, filed on Jun. 29, 2010, now Pat. No. 8,507,390, which is a division of application No. 11/495,188, filed on Jul. 28, 2006, now Pat. No. 7,776,758, which is a continuation-in-part of application No. 11/148,001, filed on Jun. 7, 2005, now Pat. No. 7,501,315.

(60) Provisional application No. 60/671,134, filed on Apr. 13, 2005, provisional application No. 60/632,570, filed on Nov. 30, 2004, provisional application No. 60/578,236, filed on Jun. 8, 2004.

(51) Int. Cl.
*H01L 21/31* (2006.01)
*H01L 21/3105* (2006.01)
*H01L 21/28* (2006.01)

(52) U.S. Cl.
CPC ...... *H01L 21/3105* (2013.01); *H01L 21/28008* (2013.01); *Y10S 977/782* (2013.01); *Y10S 977/845* (2013.01); *Y10S 977/855* (2013.01)
USPC ........... 438/128; 438/585; 438/674; 438/782; 977/782; 977/845; 977/855; 257/E21.41

(58) Field of Classification Search
CPC ..................... H01L 21/3105; H01L 21/28008
USPC .......... 438/128, 758, 674, 585, 782; 977/845, 977/855, 782
See application file for complete search history.

(56) References Cited

U.S. PATENT DOCUMENTS 3,514,320 A 5/1970 Vaughan
3,615,956 A 10/1971 Irving et al.
(Continued)

FOREIGN PATENT DOCUMENTS

CN 1320931 4/2001
EP 1034234 7/2003
(Continued)

OTHER PUBLICATIONS

Preliminary Amendment of related U.S. Appl. No. 11/148,001, filed Sep. 9, 2005.

(Continued)

*Primary Examiner* — Alexander Ghyka
(74) *Attorney, Agent, or Firm* — Vierra Magen Marcus LLP

(57) ABSTRACT

Methods for forming or patterning nanostructure arrays are provided. The methods involve formation of arrays on coatings comprising nanostructure association groups, formation of arrays in spin-on-dielectrics, solvent annealing after nanostructure deposition, patterning using resist, and/or use of devices that facilitate array formation. Related devices for forming nanostructure arrays are also provided, as are devices including nanostructure arrays (e.g., memory devices).

39 Claims, 11 Drawing Sheets

(56) References Cited

U.S. PATENT DOCUMENTS

| | | |
|---|---|---|
| 3,994,793 A | 11/1976 | Harvilchuck et al. |
| 4,057,460 A | 11/1977 | Saxena et al. |
| 4,414,066 A | 11/1983 | Forrest et al. |
| 4,464,223 A | 8/1984 | Gorin |
| 4,523,976 A | 6/1985 | Bukhman |
| 4,595,454 A | 6/1986 | Dautremont-Smith et al. |
| 4,599,136 A | 7/1986 | Araps et al. |
| 4,639,301 A | 1/1987 | Doherty et al. |
| 5,043,940 A | 8/1991 | Harari |
| 5,092,957 A | 3/1992 | Ashby et al. |
| 5,149,974 A | 9/1992 | Kirch et al. |
| 5,434,825 A | 7/1995 | Harari |
| 5,489,233 A | 2/1996 | Cook et al. |
| 5,505,928 A | 4/1996 | Alivisatos et al. |
| 5,527,423 A | 6/1996 | Neville et al. |
| 5,609,907 A | 3/1997 | Natan |
| 5,690,807 A | 11/1997 | Clark, Jr. et al. |
| 5,701,221 A | 12/1997 | Taniyama et al. |
| 5,714,766 A | 2/1998 | Chen et al. |
| 5,751,018 A | 5/1998 | Alivisatos et al. |
| 5,768,192 A | 6/1998 | Eitan |
| 5,820,689 A | 10/1998 | Tseng et al. |
| 5,852,306 A | 12/1998 | Forbes |
| 5,897,945 A | 4/1999 | Lieber et al. |
| 5,937,295 A | 8/1999 | Chen et al. |
| 5,958,794 A | 9/1999 | Bruxvoort et al. |
| 5,990,479 A | 11/1999 | Weiss et al. |
| 5,997,832 A | 12/1999 | Lieber et al. |
| 6,036,774 A | 3/2000 | Lieber et al. |
| 6,048,616 A | 4/2000 | Gallagher et al. |
| 6,054,349 A | 4/2000 | Nakajima et al. |
| 6,060,743 A | 5/2000 | Sugiyama et al. |
| 6,062,968 A | 5/2000 | Sevilla et al. |
| 6,090,666 A | 7/2000 | Ueda et al. |
| 6,107,008 A | 8/2000 | Howell et al. |
| 6,117,000 A | 9/2000 | Anjur et al. |
| 6,126,532 A | 10/2000 | Sevilla et al. |
| 6,136,156 A | 10/2000 | El-Shall et al. |
| 6,139,626 A | 10/2000 | Norris et al. |
| 6,159,620 A | 12/2000 | Heath et al. |
| 6,207,229 B1 | 3/2001 | Bawendi et al. |
| 6,222,762 B1 | 4/2001 | Guterman et al. |
| 6,225,198 B1 | 5/2001 | Alivisatos et al. |
| 6,275,419 B1 | 8/2001 | Guterman et al. |
| 6,297,095 B1 | 10/2001 | Muralidhar et al. |
| 6,306,736 B1 | 10/2001 | Alivisatos et al. |
| 6,317,363 B1 | 11/2001 | Guterman et al. |
| 6,317,364 B1 | 11/2001 | Guterman et al. |
| 6,320,784 B1 | 11/2001 | Muralidhar et al. |
| 6,322,901 B1 | 11/2001 | Bawendi et al. |
| 6,340,822 B1 | 1/2002 | Brown et al. |
| 6,344,403 B1 | 2/2002 | Madhukar et al. |
| 6,413,489 B1 | 7/2002 | Ying et al. |
| 6,413,819 B1 | 7/2002 | Zafar et al. |
| 6,563,260 B1 | 5/2003 | Yamamoto et al. |
| 6,576,291 B2 | 6/2003 | Bawendi et al. |
| 6,577,532 B1 | 6/2003 | Chevallier |
| 6,586,785 B2 | 7/2003 | Flagan et al. |
| 6,597,496 B1 | 7/2003 | Nayfeh et al. |
| 6,614,069 B2 | 9/2003 | Rosner et al. |
| 6,680,505 B2 | 1/2004 | Ohba et al. |
| 6,723,606 B2 | 4/2004 | Flagan et al. |
| 6,740,910 B2 | 5/2004 | Roesner et al. |
| 6,753,538 B2 | 6/2004 | Musil et al. |
| 6,768,156 B1 | 7/2004 | Bhattacharyya |
| 6,784,103 B1 | 8/2004 | Rao et al. |
| 6,831,019 B1 | 12/2004 | Li et al. |
| 6,872,645 B2 | 3/2005 | Duan et al. |
| 6,878,871 B2 | 4/2005 | Scher et al. |
| 6,891,319 B2 | 5/2005 | Dean et al. |
| 6,927,454 B2 | 8/2005 | Chan et al. |
| 6,936,484 B2 | 8/2005 | Kanechika et al. |
| 6,949,206 B2 | 9/2005 | Whiteford et al. |
| 6,984,842 B1 | 1/2006 | Nayfeh et al. |
| 7,005,697 B2 | 2/2006 | Batra et al. |
| 7,045,851 B2 | 5/2006 | Black et al. |
| 7,067,867 B2 | 6/2006 | Duan et al. |
| 7,070,472 B2 | 7/2006 | Dean et al. |
| 7,084,507 B2 | 8/2006 | Awano |
| 7,115,526 B2 | 10/2006 | Ho et al. |
| 7,153,782 B2 | 12/2006 | Eissa |
| 7,186,381 B2 | 3/2007 | Penner et al. |
| 7,199,393 B2 * | 4/2007 | Park et al. .................. 257/40 |
| 7,267,875 B2 | 9/2007 | Whiteford et al. |
| 7,274,035 B2 | 9/2007 | Yang et al. |
| 7,309,650 B1 | 12/2007 | Wang et al. |
| 7,374,807 B2 | 5/2008 | Parce et al. |
| 7,402,829 B2 | 7/2008 | Green |
| 7,501,315 B2 | 3/2009 | Heald et al. |
| 7,557,028 B1 | 7/2009 | Scher et al. |
| 7,585,564 B2 | 9/2009 | Whiteford et al. |
| 7,692,218 B2 | 4/2010 | Barron et al. |
| 7,723,186 B2 | 5/2010 | Purayath et al. |
| 7,776,758 B2 | 8/2010 | Duan et al. |
| 7,851,784 B2 | 12/2010 | Kastalsky |
| 7,968,273 B2 | 6/2011 | Chen et al. |
| 7,976,646 B1 | 7/2011 | Ranganathan et al. |
| 8,030,161 B2 | 10/2011 | Duan et al. |
| 8,088,483 B1 | 1/2012 | Whiteford et al. |
| 8,143,703 B2 | 3/2012 | Heald et al. |
| 8,507,390 B2 * | 8/2013 | Chen et al. .................. 438/782 |
| 2001/0001703 A1 | 5/2001 | Takahashi et al. |
| 2002/0066401 A1 | 6/2002 | Peng et al. |
| 2002/0071952 A1 | 6/2002 | Bawendi et al. |
| 2002/0117659 A1 | 8/2002 | Lieber et al. |
| 2002/0118369 A1 | 8/2002 | Misewich et al. |
| 2002/0137235 A1 | 9/2002 | Rohlfing |
| 2002/0140023 A1 | 10/2002 | Ohba et al. |
| 2002/0171125 A1 | 11/2002 | Bao et al. |
| 2002/0197404 A1 | 12/2002 | Lee et al. |
| 2003/0039744 A1 | 2/2003 | Fan et al. |
| 2003/0173541 A1 | 9/2003 | Peng et al. |
| 2003/0224286 A1 | 12/2003 | Barclay et al. |
| 2003/0235064 A1 | 12/2003 | Batra et al. |
| 2004/0000427 A1 | 1/2004 | Wang et al. |
| 2004/0005258 A1 | 1/2004 | Fonash et al. |
| 2004/0023010 A1 | 2/2004 | Bulovic et al. |
| 2004/0026684 A1 | 2/2004 | Empedocles |
| 2004/0038440 A1 | 2/2004 | Hatori |
| 2004/0043219 A1 | 3/2004 | Ito et al. |
| 2004/0076757 A1 | 4/2004 | Jacobson et al. |
| 2004/0097040 A1 | 5/2004 | Kamins |
| 2004/0102050 A1 | 5/2004 | Delamarche et al. |
| 2004/0110347 A1 | 6/2004 | Yamashita |
| 2004/0191669 A1 | 9/2004 | Whitlock et al. |
| 2004/0194295 A1 | 10/2004 | Green |
| 2004/0228967 A1 | 11/2004 | Leung et al. |
| 2004/0256667 A1 | 12/2004 | Oikawa et al. |
| 2005/0072989 A1 | 4/2005 | Bawendi et al. |
| 2005/0079282 A1 | 4/2005 | Jin |
| 2005/0101063 A1 | 5/2005 | Tour et al. |
| 2005/0122775 A1 | 6/2005 | Koyanagi et al. |
| 2005/0139867 A1 | 6/2005 | Saito et al. |
| 2005/0161666 A1 | 7/2005 | Park et al. |
| 2005/0201149 A1 | 9/2005 | Duan et al. |
| 2005/0202587 A1 | 9/2005 | Redecker et al. |
| 2005/0202615 A1 | 9/2005 | Duan et al. |
| 2005/0287717 A1 | 12/2005 | Heald |
| 2006/0071598 A1 | 4/2006 | Eden et al. |
| 2006/0081835 A1 | 4/2006 | Hutchison et al. |
| 2006/0148177 A1 | 7/2006 | Kim |
| 2006/0163646 A1 | 7/2006 | Black et al. |
| 2007/0032091 A1 | 2/2007 | Heald et al. |
| 2007/0051942 A1 | 3/2007 | Brown et al. |
| 2007/0278530 A1 | 12/2007 | Seidl |
| 2007/0293031 A1 | 12/2007 | Chan et al. |
| 2008/0118755 A1 | 5/2008 | Whiteford et al. |
| 2008/0150003 A1 | 6/2008 | Chen et al. |
| 2008/0150009 A1 | 6/2008 | Chen |
| 2008/0165569 A1 | 7/2008 | Chen et al. |
| 2008/0246076 A1 | 10/2008 | Chen |
| 2008/0260941 A1 | 10/2008 | Jin |
| 2009/0155967 A1 | 6/2009 | Purayath et al. |
| 2009/0170725 A1 | 7/2009 | Yamakawa et al. |

(56) References Cited

U.S. PATENT DOCUMENTS

| | | | |
|---|---|---|---|
| 2010/0155786 | A1 | 6/2010 | Heald et al. |
| 2010/0190319 | A1 | 7/2010 | Purayath et al. |
| 2011/0034038 | A1 | 2/2011 | Chen et al. |
| 2011/0204432 | A1 | 8/2011 | Chen et al. |

FOREIGN PATENT DOCUMENTS

| | | |
|---|---|---|
| JP | 10-200001 | 7/1998 |
| JP | 2000-022129 | 1/2000 |
| JP | 2000-349275 | 12/2000 |
| KR | 2001-0099655 | 11/2001 |
| KR | 2002-0069210 | 8/2002 |
| WO | WO 99/01766 | 1/1999 |
| WO | WO-0103208 | 1/2001 |
| WO | WO-0217362 | 2/2002 |
| WO | WO-0248701 | 6/2002 |
| WO | WO 2005/001573 | 1/2005 |
| WO | WO 2005/017962 | 2/2005 |
| WO | WO 2005/022120 | 3/2005 |
| WO | WO 2005/023923 | 3/2005 |
| WO | WO 2005/028360 | 3/2005 |
| WO | WO 2006/023037 | 3/2006 |
| WO | WO 2006/076036 | 7/2006 |
| WO | WO 2007/024697 | 3/2007 |

OTHER PUBLICATIONS

Preliminary Amendment of related U.S. Appl. No. 11/148,001, filed Nov. 6, 2006.
Restriction Requirement of related U.S. Appl. No. 11/148,001 mailed Mar. 13, 2007.
Mar. 29, 2007 Reply to Restriction Requirement of related U.S. Appl. No. 11/148,001.
Restriction Requirement of related U.S. Appl. No. 11/148,001 mailed Jun. 26, 2007.
Jul. 26, 2007 Reply to Restriction Requirement of related U.S. Appl. No. 11/148,001.
Office Action of related U.S. Appl. No. 11/148,001 mailed Oct. 19, 2007.
Jan. 22, 2008 Reply to Office Action of related U.S. Appl. No. 11/148,001.
Office Action of related U.S. Appl. No. 11/148,001 mailed Apr. 17, 2008.
May 30, 2008 Reply to Office Action of related U.S. Appl. No. 11/148,001.
Notice of Allowance & Examiner Interview Summary of related U.S. Appl. No. 11/148,001 mailed Oct. 7, 2008.
Supplemental Notice of Allowability of related U.S. Appl. No. 11/148,001 mailed Oct. 22, 2008.
Amendment Under 37 CFR 1.312 of related U.S. Appl. No. 11/148,001, filed Nov. 7, 2008.
Response to Rule 312 Communication of related U.S. Appl. No. 11/148,001 mailed Nov. 20, 2008.
Fan et al., "Rapid protyping of patterned functional nanostructures," Nature, 2000, 405:56-60.
Fan et al., "Three-Dimensionally Ordered Gold Nanocrystal/Silica Superlattice Thin Films Synthesized via Sol-Gel Self Assembly," Adv. Funct. Mater., 2006, 16:891-895.
Lim et al., "Nonvolatile MOSFET memory based on high density WN nanocrystal layer fabricated by novel PNL (Pulsed Nucleation Layer) method," 2005 Symposium on VLSI Technology Digest of Technical Papers, pp. 190-191.
Schmid et al., "Silsesquioxanes as Ligands for Gold Clusters," Eur. J. Inorg. Chem., 1998, 813-817.
Atwater, H.A., "Silicon nanoparticle engineering for novel logic and memory applications," Project Overview, Functional Nanostructures Program, NSF (Jan. 2001).
Bell, L.D. et al., "A Radiation-tolerant, low-power non-volatile memory based on silicon nanocrystal quantim dots," Innovative Approaches to Outer Planetary Exploration, 2001-2020, (Publication date unknown).
Bjork, M.T. et al., "One-dimensional steeplechase for electrons realized," Nano Letters, 2002, 2:86-90.
Boderfield, M.G. et al., "Storage of electrons and holes in self-assumbled inAs quantum dots," Appl. Phys. Lett., 1999, 74(13):1839-1841.
Brown, J.F. et al., "Preparation and characterization of the lower equilibrated phenylsilsesquioxanes," J.Am. Chem. Soc., 1964 86:1120.
Brown, J.F. et al., "The polycondensation of cyclohexylsilantriol," J.Am. Chem. Soc., 1965, 87:4313-4323.
Bulgakov, A.V. et al., "Laser ablation synthesis of zinc oxide clusters: a new family of fullerenes?" Chem. Phys. Lett., 2000, 320:19-25.
Cao, Y.W. et al., "Growth and properties of semiconductor core/shell nanocrystals with InAs cores," J. Am. Chem. Soc., 2000, 122:9692-9702.
Casperson, J.D. et al., "Materials issues for layered tunnel barrier structures," J.Appl. Phys., 2002, 92(1):261-267.
Chae, D.H. et al., "Nanocrystal memory cell using high-density SiGe Quantum Dot Array," J Kor. Phys. Soc., 1999, 35:S995-S998.
Citeau, H. et al., "A novel cage organotellurate (IV) macrocyclic host encapsulating a bromide anion guest," Chem, Commun., 2001, pp. 2006-2007.
Coe, S. et al., " Electroluminescence from single monolayers of nanocrystals in molecular organic devices," Nature, 2002, 450:800-803.
Coronado, E. et al., "Polyoxometalate-Based Molecular Materials," Chem. Rev., 1998, 98:273-296.
Corso, D. et al., "Localized Charge storage in nanocrystal memories: feasibility of a multi-bit cell," (Publication and Publication date unknown).
Cui, Y et al., "Doping and electrical transport in silicon nanowires," J. Phys. Chem. B, 2000, 104:5213-5216.
Cui, Y et al., "Diameter-controlled synthesis of single-crystal silicon nanowires," Appl. Phys. Lett., 2001, 78:2214-2216.
Dabbousi, B.O. et al., "(CdSe) ZnS core-shell quantum dots: Synthesis and characterization of a size series of highly luminescent nanocrysallites," J. Phys. Chem. B, 1997, 101:9463-9475.
De Blauwe, J. "Nanoparticle Nonvolatile Memory Devices," IEEE Trans. Nanotechnology, 2002, 1:72.
Drexler, H. et al., "Spectroscopy of quantum levels in charge-tunable inGaAs quantum dots," Phys. Ref. Lett., 1994, 73:2252-2255.
Duan, X. et al., "General synthesis of compound semiconductor nanowires," Adv. Mater., 2000, 12:298-302.
Feher, F.J. et al., "Silsesquioxanes as models for silicon surfaces," J.Am. Chem. Soc., 1989, 111:1741.
Feher, F.J. et al., "Synthesis and characterization of vanadium-containing silsesquioxanes," Inorg. Chem., 1991, 30:1689-1694.
Feher, F.J. et al., "Silsesquioxanes as ligands in inorganic and organometallic chemistry," Polyhedron, 1995, 14:3239-3253.
Gigant, K. et al., "Synthesis and Molecular Structures of Some New Titanium (IV) Aryloxides," J. Am. Chem. Soc., 2001, 123:11623-11637.
Gouzerh, P. et al., "Main-group element, organic, and organometallic derivatives of polyoxometalates," Chem .Rev., 1990, 98:77-111.
Gudiksen, M.S. et al., "Diameter-selective synthesis of semiconductor nanowires," J. Am. Chem. Soc., 2000, 122:8801-8802.
Gudiksen, M.S. et al., "Synthetic control of the diameter and length of single crystal semiconductor nanowires," J. Phys. Chem. B, 2001, 105:4062-4064.
Gudiksen, M.S. et al., "Growth of nanowire superlattice structures for nanoscale photonics and electronics," Nature, 2002, 415:617-620.
Hanssen, RWJM, "On the formation and reactivity of multinuclear silsesquioxane metal complexes," 2003, Dissertation Eindhoven University of Technology.
Iannaccone, G. et al., "Simulation of a quantem-dot flash memory." J. Appl. Phys., 1998, 84(9):5032-5036.
Jun, Y.W. et al., "Controlled synthesis of mulit-armed CdS nanorod architectures using monosurfactant system," J. Am. Chem. Soc., 2001, 123:5150-5151.
Kan, E. et al., "Technology for self-assembled entities in logic and memory units below the lithography limit," Cornell Nanoscale Facility (Publication date unknown).

(56) References Cited

OTHER PUBLICATIONS

Katsoulis, D.E., "A Survey of Applications of Polyoxometalates," Chem Rev., 1998, 98:359-387.

Kim, S.W. et al., "Synthesis of monodisperse palladium nanoparticles," NanoLetters, 2003, 3:1289-1291.

Kolloipoulou, S. et al., "Hybrid silicon-organic nanoparticle memory device," J. Appl. Phys., 2003, 94(8):5234-5239.

Leaustic, A. et al.; "Photochromism of cationic spiropyran-doped silica gel," New J. Chem., 2001, 25:1297-1301.

Lin, Y.H. et al., "High-Performance Nonvaolatile HfO2 Nanocrystal Memory," IEEE Electron Device Letts., Mar. 2005, 26(3):154-156.

Liu, C. et al., "Sol-Gel Synthesis of Free-Standing Ferroelectric Lead Zirconate Titanate Nanoparticles," J. Am. Chem. Soc., 2001, 123:4344-4345.

Liu, C. et al., "A novel bimetallic cage complex constructed from siv V4Co pentatomic rings: hydrothermal synthesis and crystal structure of [(2,2'-Py2NH)2Co]3V8O23," Chem. Commun., 2001, pp. 1636-1637.

Manna, L. et al., "Synthesis of Soluble and Processable Rod-Arrow, Teardrop, and Tetraprod-Shaped CdSe Nanocrystals," J. Am. Chem. Soc., 2000, 122:12700-12706.

Manna, L. et al., "Epitaxial growth and photochemical annealing of graded CdS/ZnS shells on colloidal CdSe nanorods," J.Am. Chem. Soc., 2002, 124:7136-7145.

McCarthy, W., O'Reilly Network, :Quantum Dots and Programmable Matter, (visited Jan. 12, 2004), http://www.oreillynet.com/pub/a/network/2004/01/09quantumdots.html, 5 pages, Copyright 2000-2004, O'Reilley & Associated, Inc.

Morales, A.M. et al., "A laser ablation method for the synthesis of crystalline semiconductor nanowires," Science, 1998, 279:208-211.

Muller, A. et al. "Polyoxometalates Very Large Clusters—Nanoscale Magnets," Chem. Rev., 1998, 98:239-271.

Murray, C.B. et al., "Synthesis and characterization of nearly monodisperse CdE (E=S, Se, Te) semiconductor nanocrystals," J. Am. Chem. Soc., 1993, 115:8706-8715.

Peng, X. et al., "Epitaxial growth of highly luminescent CdSe/CdS Core/shell nanocystals with photostablity and electron accessibilty," J. Am. Chem. Soc., 1997, 119:7019-7029.

Peng, X. et al., "Shape Control of CdSe nanocrystals," Nature, 2000, 404:59-61.

Puntes, V.F. et al., "Colloidal nanocrystal shape and size control: The case of cobalt," Science, 2001, 291: 2115-2117.

Qu, L. et al., "Alternative routes toward high quality CdSe nanocrystals," NanoLetters, 2001, 1:333-337.

Rhule, J.T. et al., "Polyoxometalates in medicine," Chem. Rev., 1998, 98:327-357.

Schubert, U., "Polymers Reinforced by Covalently Bonded Inorganic Clusters," Chem. Mater., 2001, 13:3487-3494.

Sellier, C. et al., "Crystal structure and charge order below the metal-insulator transistion in the vanadium bronze B-SrV6O15," Solid State Sciences, 2003, 5:591-599.

Suzuki, A., "Recent Advanced in the Cross-Coupling Reactions of Organoboron Derivatives with Organic Electrophiles 1995-1998," J. Organomet.Chem, 1999, 576:147-168.

Takata, M. et al., "Fundamental characteristics of new non-volatile memory with extremely high density metal quantram dots," (Publication and Publication Date unknown).

Tiwari, S. et al., "Volatile and Non-Volatile Memories in Silicon with Nano-Crystal Storage," IEDM, 1995, 95:521-527.

Tiwari, S. et al., "A silicon nanocrystals based memory," Appl. Phys. Lett., 1996, 68(10:1377-1379.

Urban, J.J. et al., "Synthesis of single-crystalline perovskite nanowires composed of barium titanate and strontium titanate," J. Am. Chem. Soc., 2002, 124:1186-1187.

Vampola, K. et al., "Growth and Characterization of metal nanocrystals," Cornell Nanofabrication Facility (Publication date unknown).

Weinstock, I.A., "Homogeneous-Phase Electron-Transfer Reactions of Polyoxometalates," Chem. Rev., 1998, 98:113-170.

Wu, Y. et al., "Block-by-block growth of single-crystalline Si/SiGe superlattice nanowires," Nano Letters, 2002, 2:83-86.

Yamase, T., "Photo and electrochromism of polyoxometalates and related materials," Chem. Rev., 1998, 98:307-325.

Yang, C.C. et al., "Characterization of poly(silsesquioxane) by thermal curing," Proc. Natl. Sci. Counc. ROC, 2001, 25:339-343.

Yun, W.S. et al., "Ferroelectric Properties of Individual Barium Titanate Nanowires Investigated by Scanned Probe Microscopy," Nanoletters, 2002, 2:447-450.

Zhang, K.Q. et al., "In situ observation of colloidal monolayer nucleation driven by an alternating electric field," Nature, 2004, 429:739-743.

"ISSCC delegates eye successor to floating gate flash memory," http://www.electronicsweekly.com/article4907.htm, Feb. 25, 2004.

Silicon Storage Technology, Inc., "Technical Comparison of Floating Gate Reprogrammable Nonvolatile Memories," Technical Paper, Nov. 2001, (Copyright 2002), 8 pages.

Restriction Requirement of related U.S. Appl. No. 11/495,188 mailed Feb. 9, 2009.

Mar. 2, 2009 Reply to Restriction Requirement of related U.S. Appl. No. 11/495,188.

Office Action of related U.S. Appl. No. 11/495,188 mailed Jun. 25, 2009.

Examiner Interview Summary of related U.S. Appl. No. 11/495,188 mailedNov. 13, 2009.

Nov. 23, 2009 Reply to Office Action of related U.S. Appl. No. 11/495,188.

Final Office Action of related U.S. Appl. No. 11/495,188 mailed Feb. 18, 2012.

Notice of Allowance & Examiner Interview Summary of related U.S. Appl. No. 11/495,188 mailed Apr. 15, 2010.

Amendment Under 37 CFR 1.312 of related U.S. Appl. No. 11/495,188 filed May 20, 2010.

Response to Rule 312 Communication of related U.S. Appl. No. 11/495,188 mailed Jun. 17, 2010.

Preliminary Amendment of related U.S. Appl. No. 12/803,568, filed Jun. 29, 2010.

Restriction Requirement of related U.S. Appl. No. 12/803,568 mailed Jun. 23, 2011.

Jul. 8, 2011 Reply to Restriction Requirement of related U.S. Appl. No. 12/803,568.

Office Action of related U.S. Appl. No. 12/803,568 mailed Sep. 21, 2011.

Dec. 21, 2011 Reply to Office Action of related U.S. Appl. No. 12/803,568.

Final Office Action of related U.S. Appl. No. 12/803,568 mailed Feb. 15, 2012.

Mar. 30, 2012 Reply to Final Office Action & Terminal Dislaimer of related U.S. Appl. No. 12/803,568.

Terminal Disclaimer of related U.S. Appl. No. 12/803,568 mailed Apr. 13, 2012.

Notice of Allowance of related U.S. Appl. No. 12/803,568 mailed Apr. 16, 2012.

Liz-Marzan et al., "Synthesis of nanosized-gold-silica core-shell partidles," Langmuir, 1996, 12:4329-4335.

Sunahara, K. et al., "New BST-silica suspension coating material for dielectric thin films fabricated at low temperatures," Adv. Appl. Ceramics, 2006, 105(3):153-157.

Gerion et al., "Synthesis and properties of biocompatible water-soluble silica-coated CdSe/ZnS semiconductor quantum dots," J. Phys. Chem. B, 2001, 105:8861-8871.

Giersig et al., "Direct observations of chemical reactions in silica-coated gold and silver nanoparticles," Adv. Mater., 1997, 9(7):570-575.

Schroedter & Weller, "Ligand design and bioconjugation of collodial gold nanoparticles," Angew, Chem., 2002, 41(17):3218-3221.

Bruchez et al., "Semiconductor nanocrystals as fluorescent biological labels," Science, 1998, 281:2013-2016.

Correa-Duarte et al., "Stabilization of CdS seminconductor nanoparticles against photodegradation by a silica coating procedure," Chemical Physics Letters, 1998, 286:497-501.

(56) References Cited

OTHER PUBLICATIONS

Rosario et al., "Lotus effect amplifies light-induce contact angle switching," Journal of Physical Chemistry: B, 2004, 108:12640-12642.
Preliminary Amendment of related U.S. Appl. No. 11/881,739, filed Oct. 15, 2007.
Restriction Requirement of related U.S. Appl. No. 11/881,739 mailed Aug. 9, 2010.
Aug. 30, 2010 Reply to Restriction Requirement of related U.S. Appl. No. 11/881,739.
Office Action of related U.S. Appl. No. 11/881,739 mailed Oct. 8, 2010.
Jan. 11, 2011 Reply to Office Action of related U.S. Appl. No. 11/881,739.
Notice of Allowance of related U.S. Appl. No. 11/881,739 mailed Feb. 16, 2011.
Cassagrleau, T. et al., "Contiguous Silver Nanoparticle Coatings on Dielectric Spheres," Advanced Materials, 2002, 14(10):732-736.
Preliminary Amendment of related U.S. Appl. No. 12/291,101, filed Nov. 5, 2008.
Preliminary Amendment of related U.S. Appl. No. 12/291,101, filed May 11, 2009.
Office Action of related U.S. Appl. No. 12/291,101 mailed Sep. 28, 2011.
Nov. 9, 2011 Reply to Office Action of related U.S. Appl. No. 12/291,101.
Notice of Allowance of related U.S. Appl. No. 12/291,101 mailed Nov. 28, 2011.
Office Action of related Chinese Application No. 200780028495.7 dated Jul. 5, 2010.
Extended Search Report of related European Application No. EP07797046.5 dated Apr. 29, 2011.
Rules 161 and 162 Communication of related European Application No. EP07797046.5 dated Oct. 3, 2009.
International Search Report of related International Application No. PCT/US07/016948 dated Dec. 26, 2007.
International Preliminary Report on Patentability & Written Opinion of related International Application No. PCT/US07/016948 dated Feb. 12, 2009.
Office Action of related Australian Application No. 2005253604 dated May 6, 2010.
Feb. 10, 2011 Reply to Office Action of related Australian Application No. 2005253604.
Office Action of related Australian Application No. 2005253604 dated Feb. 21, 2011.
May 5, 2011 Reply to Office Action of related Australian Application No. 2005253604.
Office Action of related Australian Application No. 2005253604 dated Jun. 3, 2011.
Aug. 5, 2011 Reply to Office Action of related Australian Application No. 2005253604.
Office Action of related Chinese Application No. 200580018709.3 dated May 8, 2009.
Office Action of related Chinese Application No. 200580018709.3 dated Sep. 11, 2009.
Office Action of related Chinese Application No. 201010245267.9 dated Sep. 26, 2011.
Office Action of related Japanese Application No. 2007-527682 dated Dec. 13, 2011.
Office Action of related Japanese Application No. 2007-527682 dated Mar. 6, 2012.
Office Action of related Korean Application No. 10-2007-7000502 dated Apr. 23, 2012.
International Search Report of related International Application No. PCT/US05/020104 dated Mar. 20, 2007.
International Preliminary Report on Patentability & Written Opinion of related International Application No. PCT/US05/020104 dated Jun. 7, 2007.
Restriction Requirement of related U.S. Appl. No. 13/098,082 mailed Jul. 19, 2012.
Aug. 16, 2012 Response to Jul. 19, 2012 Restriction Requirement of related U.S. Appl. No. 13/098,082.
Notice of Allowance in related U.S. Appl. No. 12/803,568 mailed Sep. 11, 2012.
Second Office Action in related Chinese Application No. 201010245267.9 dated Jul. 20, 2012.
Aug. 23, 2012 Response to Apr. 23, 2012 Office Action of related Korean Application No. 10-2007-7000502.
Sep. 29, 2012 Response to Jul. 20, 2012 Second Office Action in related Chinese Application No. 201010245267.9.
Office Action of related U.S. Appl. No. 13/098,082 dated Nov. 20, 2012.
Chen, U.S. Appl. No. 13/529,498, filed Jun. 21, 2012.
Chen et al., "Chalcogenide memory looks promising," EE Times, Published Sep. 19, 2003, {Online: www.eetimes.com/in_focus/silicon_engineering/OEG20030919S0044}Family).
Ashby, "Photochemical dry etching of GaAs," Appl. Phys. Lett., (1984), 45:892-894.
Ashby, "Composition-selective photochemical etching of compound semiconductors," Appl. Phys. Lett., (1985), 47:62-63.
Choi et al., "Nanopatterned Magnetic Metal via Colloidal Lithography with Reactive Ion Etching," Chem. Mater., (2004), 16:4208-4211.
Evans, P.R. et al., "Toward Self-Assembled Ferroelectric Random Access Memories; Hard-Wired Switching Capacitor Arrays with Almost Tb/in2 Densities," NanLett (2007), 7(5):1134-1137.
Guarini, K.W., "Low voltage, scalable nanocrystal FLASH memory fabricated by templated self-assembly," IEDM Conf., 2003, pp. 03:541-544.
Haupt, M. et al., "Polymer Masks on Semiconductors: A Novel Way to Nanostructures," Phys. Status Solidi, (2001), 224(3):867-870.
Liang, E. Z. et al., "Use of SiO2 nanoparticles as etch mask to generate Si nanorods by reactive ion etch," J. Vacuum Sci & Tech. B24(2), Mar./Apr. 2006, pp. 599-603.
Matsui et al., "Electron beam induced selective etching and deposition technology," J. Vac. Sci & Tech B 7 (5), Sep./Oct. 1989, pp. 1182-1190.
Moyen, E. et al., "Etchng nano-holes in silicon carbide using catalytic platinum nanoparticles," Appl. Phys., (2006), 84:369-371.
Park, H. et al., "Formation of graphite nanocones using metal nanoparticles as plasma etching masks,"J. Vac. Sci. Technol. B 22(3), May/Jun. 2004, pp. 1290-1293.
Takano, A. et al., "AIST's Low Cost Anti-Reflection Lens Technology Uses Metal Nanoparticles on Die Surface," Tech on, (2007), http://techon.nikkeipb.co.jp/english/NEWS_EN/20070424/131598/.
Takata, M. et al., "New Non-Volatile Memory with Extremely High Density Metal Nano-Dots," International Electron Devices Meeting 2003, IEEE, IEDM, Technical Digest, pp. 553-556.
Winkler et al., "E-Beam Probe Station with Integrated Tool for Electron Beam Induced Etching," Microelectronic Eng, (1996), 31:141-147.
Sze, S.M., "Semiconductor Devices Physics and Technology," John Wiley & Sons, New York, (1985), pp. 436-442.
Sze, S.M., Physics of Semiconductor Devices 2nd Edition, John Wiley & Sons, New York, Chapter 6 (1981).
Office Action in related Japanese Patent Application No. 2009-522811 dated Nov. 27, 2012.
Notice of Allowance in related U.S. Appl. No. 12/803,568 mailed Dec. 26, 2012.
Office Action in related Canadian Patent Application No. 2,567,930 dated Dec. 27, 2012.
Feb. 20, 2013 Response to Nov. 20, 2012 Office Action of related U.S. Appl. No. 13/098,082.
Feb. 26, 2013 Reply to Nov. 27, 2012 Office Action in related Japanese Patent Application No. 2009-522811.
Notice of Allowance in related U.S. Appl. No. 12/803,568 mailed Apr. 29, 2013.
Notice of Allowance of related U.S. Appl. No. 13/098,082 mailed Apr. 4, 2013.

(56) References Cited

OTHER PUBLICATIONS

Office Action of related Chinese Application No. 201010245267.9 dated Mar. 1, 2013.
Notice of Allowance of related U.S. Appl. No. 13/098,082 mailed Jun. 19, 2013.
Office Action in related Korean Patent Application No. 2009-7003931 dated Aug. 1, 2013.
Response to Office Action filed Oct. 1, 2013 in related Korean Patent Application No. 2009-7003931.
U.S. Appl. No. 14/032,540, filed Sep. 20, 2013.
Office Action dated Dec. 20, 2013 in related European Patent Application No. 05786766.5.
Response to Office Action filed Jan. 22, 2014 in related European Patent Application No. 05786766.5.

* cited by examiner

METHODS AND DEVICES FOR FORMING NANOSTRUCTURE MONOLAYERS AND DEVICES INCLUDING SUCH MONOLAYERS

CROSS-REFERENCE TO RELATED APPLICATIONS

This application is a continuation of U.S. patent application Ser. No. 12/803,568, filed Jun. 29, 2010, now U.S. Pat. No. 8,507,390, which is a division of U.S. patent application Ser. No. 11/495,188, filed Jul. 28, 2006, now U.S. Pat. No. 7,776,758, which is a continuation-in-part of U.S. patent application Ser. No. 11/148,001, filed Jun. 7, 2005, now U.S. Pat. No. 7,501,315, which claims priority to and benefit of the following prior provisional patent applications: U.S. Provisional Patent Application Ser. No. 60/671,134, filed Apr. 13, 2005, U.S. Provisional Patent Application Ser. No. 60/632,570, filed Nov. 30, 2004, and U.S. Provisional Patent Application Ser. No. 60/578,236, filed Jun. 8, 2004. Each of these applications is incorporated herein by reference in its entirety for all purposes.

BACKGROUND

This invention relates primarily to the field of nanotechnology. More specifically, the invention pertains to methods and devices for forming nanostructure arrays, e.g., monolayer arrays, e.g., of predetermined size and/or at predetermined positions, and to devices (e.g., memory devices) including such nanostructure arrays.

Monolayers of nanostructures (e.g., quantum dots) can serve as components of a variety of optoelectronic devices such as LEDs and memory devices (see, e.g., Flagan et al. U.S. Pat. No. 6,586,785). Methods for producing such monolayers include growing quantum dots in situ on a solid by molecular beam epitaxy, and exploiting phase segregation between aliphatic surfactants on quantum dots and aromatic conjugated organic materials deposited on the dots (Coe et al. (2002) "Electroluminescence from single monolayers of nanocrystals in molecular organic devices" Nature 450:800-803). However, the former technique is difficult to scale up to form large numbers of monolayers, and the latter technique produces a layer of nanostructures embedded in or disposed on a thick organic matrix whose presence is undesirable in many device fabrication processes.

Methods for simply and reproducibly forming nanostructure monolayers are thus desirable. Among other aspects, the present invention provides such methods. A complete understanding of the invention will be obtained upon review of the following.

SUMMARY

Methods for forming or patterning nanostructure arrays, e.g., ordered or disordered monolayer arrays, are described. The methods involve formation of arrays on coatings comprising nanostructure association groups, formation of arrays in spin-on-dielectrics, solvent annealing after nanostructure deposition, patterning using resist, and/or use of devices that facilitate array formation. The arrays are optionally formed at predetermined positions and/or have predetermined dimensions. Devices related to the methods are also provided, as are devices including nanostructure arrays.

One general class of embodiments provides methods for forming a nanostructure array. In the methods, a first layer is provided, as are nanostructures dispersed in a solution comprising a liquid form of a spin-on-dielectric. The solution is disposed on the first layer, whereby the nanostructures form a monolayer array on the first layer. The liquid form of the spin-on-dielectric is then cured to provide a solid form of the spin-on-dielectric. The monolayer array of nanostructures is embedded in the resulting solid spin-on-dielectric matrix.

The first layer can comprise essentially any desired material, including, but not limited to, a semiconductor or a dielectric material such as an oxide (e.g., a metal oxide, silicon oxide, hafnium oxide, or alumina ($Al_2O_3$), or a combination of such oxides) or a nitride (e.g., silicon nitride). The first layer is optionally treated prior to disposition of the solution, e.g., with a compound such as hexamethyldisilizane (HMDS) or a silane. Thus, for example, the first layer can comprise silicon oxide or silicon nitride coated with HMDS. The first layer is optionally disposed on a substrate, e.g., a substrate comprising a semiconductor. In one class of embodiments, the first layer has a thickness of between about 1 nm and about 10 nm, e.g., between 3 and 4 nm. The substrate can include a source region, a drain region, and a channel region between the source and drain regions and underlying the monolayer array of nanostructures, and the methods include disposing a gate electrode on the solid form of the spin-on-dielectric material. Optionally, the thickness of the control dielectric is increased by disposing a dielectric layer on the solid form of the spin-on-dielectric, prior to disposing the gate electrode on the solid form of the spin-on-dielectric material.

The solution including the nanostructures and the liquid spin-on-dielectric can be disposed on the first layer by essentially any convenient technique. For example, the first layer can be spin coated with the solution.

A large number of spin-on-dielectric materials are known in the art and can be adapted to the methods. As just a few examples, the solid form of the spin-on-dielectric can comprise silicon oxide, aluminum oxide, hafnium oxide, lanthanum oxide, or tantalum oxide. Similarly, the liquid form of the spin-on-dielectric can comprise aluminum i-propoxide, tri-methyl aluminum, tri-ethyl aluminum, hafnium t-butoxide, hafnium ethoxide, tetrabenzyl hafnium, tris(cyclopentadienyl)lanthanum, tris(i-propylcyclopentadienyl)lanthanum, pentakis(dimethylamino)tantalum, tantalum methoxide, or tantalum ethoxide.

In one class of embodiments, the spin-on-dielectric is a spin-on-glass. The liquid form of the spin-on-glass can comprise a silicon compound that forms a silicon oxide (e.g., $SiO_2$) after curing. For example, the liquid form of the spin-on-glass can include a silsesquioxane, e.g., mercapto-propyl-cyclohexyl polyhedral oligomeric silsesquioxane, hydrogen silsesquioxane, octavinyl dimethyl silyl silsesquioxane, octasilane silsesquioxane, or octavinyl-T8 silsesquioxane.

In one class of embodiments, the liquid form of the spin-on-dielectric comprises a photopolymerizable compound (e.g., hydrogen silsesquioxane or octavinyl-T8 silsesquioxane). Use of a photopolymerizable spin-on-dielectric can facilitate patterning of the monolayer array. Accordingly, in one class of embodiments, at least a first region of the first layer and the solution disposed thereon are exposed to light of an appropriate wavelength, thereby curing the spin-on-dielectric in the first region. Simultaneously, at least a second region of the first layer and the solution disposed thereon are protected from the light, whereby the spin-on-dielectric in the second region remains uncured. The uncured spin-on-dielectric and the nanostructures therein are then removed from the first layer without removing the cured spin-on-dielectric and the nanostructures therein, leaving one or more monolayer arrays on the first layer.

The methods can be used to produce essentially any number of monolayer arrays. For example, two or more, 10 or more, 50 or more, 100 or more, 1000 or more, $1\times10^4$ or more, $1\times10^6$ or more, $1\times10^9$ or more, or even $1\times10^{12}$ or more discrete regions of the first layer and the solution disposed thereon can be exposed to the light, such that a like number of discrete nanostructure monolayer arrays remains on the first layer.

The monolayer array of nanostructures is typically a disordered array. The array (or each of multiple arrays) produced by the methods optionally has a high density of nanostructures. For example, the monolayer array of nanostructures optionally has a density greater than about $1\times10^{10}$ nanostructures/cm$^2$, greater than about $1\times10^{11}$ nanostructures/cm$^2$, greater than about $1\times10^{12}$ nanostructures/cm$^2$, or even greater than about $1\times10^{13}$ nanostructures/cm$^2$. Variation in the density of the nanostructures across the array is preferably low. For example, variation in density of the nanostructures in the monolayer array can be less than 10% across the monolayer, e.g., less than 5%.

The nanostructures are optionally substantially spherical nanostructures or quantum dots. The nanostructures can comprise essentially any desired material. In one class of embodiments, the nanostructures have a work function of about 4.5 eV or higher. For example, the nanostructures can comprise palladium, nickel, or ruthenium.

Devices produced by or useful in practicing the methods of the invention are also a feature of the invention. Thus, another general class of embodiments provides a device including a first layer, a liquid or solid form of a spin-on-dielectric disposed on the first layer, and a monolayer of nanostructures disposed on the first layer in the spin-on-dielectric.

Essentially all of the features noted for the methods above apply to these embodiments as well, as relevant; for example, with respect to composition of the liquid and/or solid form of the spin-on-dielectric, first layer, substrate, and nanostructures.

One general class of embodiments provides a device that includes a substrate and two or more nanostructure arrays disposed on the substrate. Each nanostructure array is disposed at a predetermined position on the substrate (e.g., a semiconductor, a quartz substrate, or a silicon wafer or portion thereof).

In one class of embodiments, a first layer is disposed between the nanostructure arrays and the substrate. Exemplary materials for the first layer have been described above. The first layer optionally includes a coating comprising a composition including a nanostructure association group. In one class of embodiments, the first layer comprises a dielectric material and has a thickness of between about 1 nm and about 10 nm, e.g., between 3 and 4 nm. In some embodiments, for each monolayer array of nanostructures, the substrate comprises a source region, a drain region, and a channel region between the source and drain regions and underlying the monolayer array of nanostructures; a control dielectric layer is disposed on each monolayer array of nanostructures; and a gate electrode is disposed on each control dielectric layer.

The device can include essentially any number of nanostructure arrays, for example, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more nanostructure arrays. Similarly, the arrays can be of essentially any desired size and/or shape. For example, each nanostructure array can have an area of about $10^4$ μm$^2$ or less, about $10^3$ μm$^2$ or less, about $10^2$ μm$^2$ or less, about 10 μm$^2$ or less, about 1 μm$^2$ or less, about $10^5$ nm$^2$ or less, about $10^4$ nm$^2$ or less, or even about 4225 nm$^2$ or less, about 2025 nm$^2$ or less, about 1225 nm$^2$ or less, about 625 nm$^2$ or less, or about 324 nm$^2$ or less. Each nanostructure array optionally has dimensions of about 45×45 nm or less, about 35×35 nm or less, about 25×25 nm or less, or about 18×18 nm or less.

In one aspect, each nanostructure array comprises an ordered array and/or a monolayer, e.g., a hexagonal-close-packed monolayer. For many applications, however, ordered arrays are not required. For example, for arrays for use in memory devices, the nanostructures need not be ordered in the arrays as long as they achieve sufficient density in disordered arrays. Thus, in another aspect, each nanostructure array comprises a disordered array, e.g., a disordered monolayer array. The nanostructure arrays (e.g., disordered monolayer arrays) are optionally embedded in a solid form of a spin-on-dielectric or a solid form of a spin-on-glass.

In one class of embodiments, the arrays have a high density of nanostructures. For example, each nanostructure array optionally has a density greater than about $1\times10^{10}$ nanostructures/cm$^2$, greater than about $1\times10^{11}$ nanostructures/cm$^2$, greater than about $1\times10^{12}$ nanostructures/cm$^2$, or even greater than about $1\times10^{13}$ nanostructures/cm$^2$.

In one class of embodiments, the nanostructures comprise substantially spherical nanostructures or quantum dots. The nanostructures can comprise essentially any desired material, chosen, e.g., based on the desired application. For example, the nanostructures can comprise a conductive material, a nonconductive material, a semiconductor, and/or the like. In one aspect, the nanostructures comprising the arrays have a work function of about 4.5 eV or higher. The nanostructures comprising the arrays are typically preformed, that is, synthesized prior to their incorporation in the array. For example, in one aspect, the nanostructures are colloidal nanostructures. In one class of embodiments, each of the nanostructures comprising the arrays comprises a coating comprising a ligand associated with a surface of the nanostructure, e.g., a silsesquioxane ligand.

Another general class of embodiments provides methods for patterning a nanostructure monolayer. In the methods, resist and a monolayer of nanostructures embedded in the resist are disposed on a first layer, to provide a resist layer. A predetermined pattern on the resist layer is exposed (e.g., to light, an electron beam, x-rays, etc.), to provide exposed resist in at least a first region of the resist layer and unexposed resist in at least a second region of the resist layer. Either the exposed resist and its embedded nanostructures are removed from the first layer without removing the unexposed resist and its embedded nanostructures, or the unexposed resist and its embedded nanostructures are removed from the first layer without removing the exposed resist and its embedded nanostructures. At least one nanostructure monolayer array defined by the first region remains on the first layer.

The resist layer can be formed by essentially any convenient technique. For example, the first layer can be spin coated with a solution comprising the resist and the nanostructures.

The methods can be used to produce essentially any number of monolayer arrays. For example, when positive resist is used, the unexposed resist can be provided in two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete second regions of the resist layer, such that two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete nanostructure monolayer arrays remain on the first layer. Similarly, when negative resist is used, exposed resist can be provided in two or more, 10 or more, 50 or more, 100 or more, 1000 or more, $1\times10^4$ or more, $1\times10^6$ or more, $1 \times 10^9$ or more, $1 \times 10^{10}$ or more, $1 \times 10^{11}$ or more, or $1 \times 10^{12}$ or more discrete first regions of the resist layer, such that a like number of discrete nanostructure monolayer arrays remains on the first layer.

Optionally, a negative resist comprises a silicon compound and the exposed resist silicon oxide (e.g., $SiO_2$). For example, the resist can be a silsesquioxane, such as mercapto-propyl-cyclohexyl polyhedral oligomeric silsesquioxane, hydrogen silsesquioxane, octavinyl dimethyl silyl silsesquioxane, octasilane silsesquioxane, or octavinyl-T8 silsesquioxane. In one class of embodiments, the silsesquioxane is photopolymerizable.

Essentially all of the features noted for the methods above apply to these embodiments as well, as relevant; for example, with respect to composition and/or treatment of the first layer, disposition of the first layer on a substrate, composition of the substrate, incorporation of the array(s) into transistor(s), nanostructure shape and composition, size and density of the array(s), and the like. It is worth noting that the monolayer array (or each of multiple arrays) can comprise an ordered array or, typically, a disordered array.

As noted, devices produced by or useful in practicing the methods of the invention are also a feature of the invention. Thus, another general class of embodiments provides a device comprising a first layer, a monolayer array of nanostructures disposed on the first layer, and resist disposed on the first layer. In one class of embodiments, the resist comprises a resist layer disposed on the monolayer array of nanostructures. In another class of embodiments, the resist occupies a first region of the first layer and the monolayer array of nanostructures occupies a second region of the first layer, adjacent to the first region. In yet another class of embodiments, the monolayer array of nanostructures is embedded in the resist.

Essentially all of the features noted for the methods above apply to these embodiments as well, as relevant; for example, with respect to composition of the first layer, coating of the first layer, disposition of the first layer on a substrate, composition of the substrate, incorporation of the array(s) into transistor(s), nanostructure shape and composition, nanostructure ligands, size and density of the array(s), and the like. It is worth noting that the monolayer array (or each of multiple arrays) can comprise an ordered array or a disordered array.

One aspect of the invention provides methods that facilitate monolayer formation by employing solvent annealing to improve monolayer quality. Accordingly, one general class of embodiments provides methods for forming a nanostructure array. In the methods, a first layer is provided and a population of nanostructures is deposited on the first layer. The nanostructures deposited on the first layer are exposed to extrinsic solvent vapor, whereby the nanostructures assemble into a monolayer array. The nanostructures can be exposed to the solvent vapor by providing a first solvent in liquid form and heating the first solvent, e.g., to a temperature between 50° C. and the boiling point of the first solvent, to produce the solvent vapor.

The nanostructures can be deposited on the first layer by dispersing them in a solution comprising a second solvent and disposing the resulting solution on the first layer. The solution comprising the nanostructures can be applied to the first layer by essentially any technique known in the art, for example, spray coating, flow coating, capillary coating, dip coating, roll coating, ink-jet printing, spin coating, or other wet coating techniques. Typically, the solution is disposed on the first layer by a technique other than spin coating.

In one class of embodiments, the methods include evaporating the second solvent in which the nanostructures were dispersed to provide dry nanostructures deposited on the first layer, after disposing the solution on the first layer and prior to exposing the nanostructures to the solvent vapor. The dry nanostructures deposited on the first layer are optionally exposed to air, typically at ambient temperature, prior to exposing the nanostructures to the solvent vapor.

As for the other embodiments described herein, the first layer can comprise essentially any desired material, e.g., a conductive material, a nonconductive material, a semiconductor, or the like, including, for example, a silicon wafer or a flexible material such as a plastic. The first layer optionally comprises a dielectric material such as an oxide or nitride, e.g., silicon oxide, hafnium oxide, alumina, or silicon nitride, and is optionally disposed on a substrate.

The resulting monolayer array of nanostructures can comprise an ordered array or a disordered array. The array optionally has a density greater than about $1 \times 10^{10}$ nanostructures/$cm^2$, greater than about $1 \times 10^{11}$ nanostructures/$cm^2$, greater than about $1 \times 10^{12}$ nanostructures/$cm^2$, or greater than about $1 \times 10^{13}$ nanostructures/$cm^2$.

Essentially all of the features noted for the embodiments above apply to these embodiments as well, as relevant; for example, with respect to incorporation of the array(s) into transistor(s), nanostructure shape and composition, nanostructure ligands, size of the array(s), and the like. For example, the nanostructures are optionally substantially spherical nanostructures or quantum dots. The nanostructures can comprise essentially any desired material. In one class of embodiments, the nanostructures have a work function of about 4.5 eV or higher.

Figure 1:
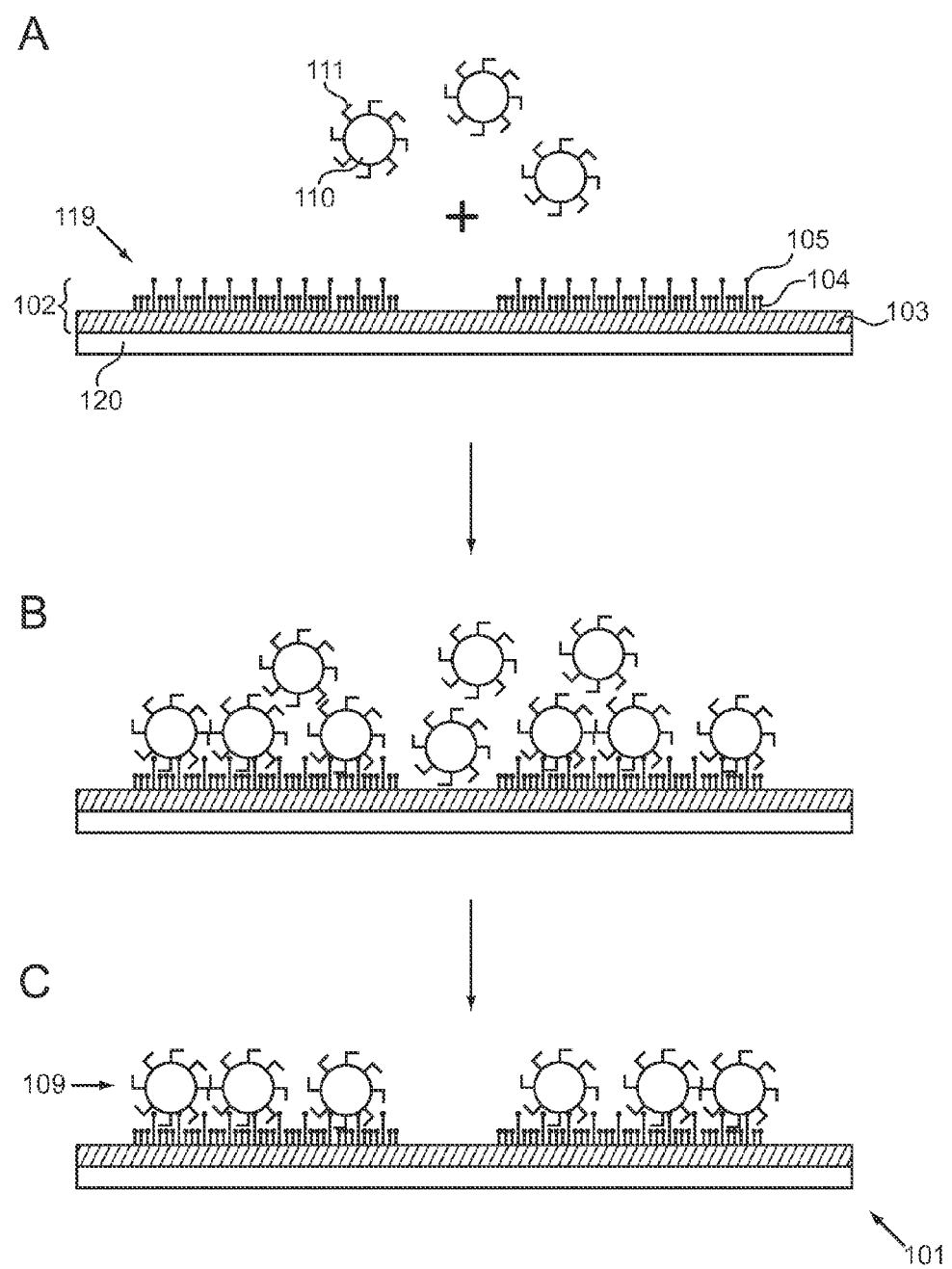
FIG. 1 Panels A-C schematically illustrate formation of monolayer arrays of nanostructures on a coated first layer, where discrete regions of the first layer are coated.

Figures are not necessarily to scale.

DEFINITIONS

Unless defined otherwise, all technical and scientific terms used herein have the same meaning as commonly understood by one of ordinary skill in the art to which the invention pertains. The following definitions supplement those in the art and are directed to the current application and are not to be imputed to any related or unrelated case, e.g., to any commonly owned patent or application. Although any methods and materials similar or equivalent to those described herein can be used in the practice for testing of the present invention, the preferred materials and methods are described herein. Accordingly, the terminology used herein is for the purpose of describing particular embodiments only, and is not intended to be limiting.

As used in this specification and the appended claims, the singular forms "a," "an" and "the" include plural referents unless the context clearly dictates otherwise. Thus, for example, reference to "a nanostructure" includes a plurality of such nanostructures, and the like.

The term "about" as used herein indicates the value of a given quantity varies by +/−10% of the value, or optionally +/−5% of the value, or in some embodiments, by +/−1% of the value so described.

A "nanostructure" is a structure having at least one region or characteristic dimension with a dimension of less than about 500 nm, e.g., less than about 200 nm, less than about 100 nm, less than about 50 nm, or even less than about 20 nm. Typically, the region or characteristic dimension will be along the smallest axis of the structure. Examples of such structures include nanowires, nanorods, nanotubes, branched nanostructures, nanotetrapods, tripods, bipods, nanocrystals, nanodots, quantum dots, nanoparticles, and the like. Nanostructures can be, e.g., substantially crystalline, substantially monocrystalline, polycrystalline, amorphous, or a combination thereof. In one aspect, each of the three dimensions of the nanostructure has a dimension of less than about 500 nm, e.g., less than about 200 nm, less than about 100 nm, less than about 50 nm, or even less than about 20 nm.

An "aspect ratio" is the length of a first axis of a nanostructure divided by the average of the lengths of the second and third axes of the nanostructure, where the second and third axes are the two axes whose lengths are most nearly equal each other. For example, the aspect ratio for a perfect rod would be the length of its long axis divided by the diameter of a cross-section perpendicular to (normal to) the long axis.

As used herein, the "diameter" of a nanostructure refers to the diameter of a cross-section normal to a first axis of the nanostructure, where the first axis has the greatest difference in length with respect to the second and third axes (the second and third axes are the two axes whose lengths most nearly equal each other). The first axis is not necessarily the longest axis of the nanostructure; e.g., for a disk-shaped nanostructure, the cross-section would be a substantially circular cross-section normal to the short longitudinal axis of the disk. Where the cross-section is not circular, the diameter is the average of the major and minor axes of that cross-section. For an elongated or high aspect ratio nanostructure, such as a nanowire or nanorod, a diameter is typically measured across a cross-section perpendicular to the longest axis of the nanowire or nanorod. For spherical nanostructures such as quantum dots, the diameter is measured from one side to the other through the center of the sphere.

The terms "crystalline" or "substantially crystalline," when used with respect to nanostructures, refer to the fact that the nanostructures typically exhibit long-range ordering across one or more dimensions of the structure. It will be understood by one of skill in the art that the term "long range ordering" will depend on the absolute size of the specific nanostructures, as ordering for a single crystal cannot extend beyond the boundaries of the crystal. In this case, "long-range ordering" will mean substantial order across at least the majority of the dimension of the nanostructure. In some instances, a nanostructure can bear an oxide or other coating, or can be comprised of a core and at least one shell. In such instances it will be appreciated that the oxide, shell(s), or other coating need not exhibit such ordering (e.g. it can be amorphous, polycrystalline, or otherwise). In such instances, the phrase "crystalline," "substantially crystalline," "substantially monocrystalline," or "monocrystalline" refers to the central core of the nanostructure (excluding the coating layers or shells). The terms "crystalline" or "substantially crystalline" as used herein are intended to also encompass structures comprising various defects, stacking faults, atomic substitutions, and the like, as long as the structure exhibits substantial long range ordering (e.g., order over at least about 80% of the length of at least one axis of the nanostructure or its core). In addition, it will be appreciated that the interface between a core and the outside of a nanostructure or between a core and an adjacent shell or between a shell and a second adjacent shell may contain non-crystalline regions and may even be amorphous. This does not prevent the nanostructure from being crystalline or substantially crystalline as defined herein.

The term "monocrystalline" when used with respect to a nanostructure indicates that the nanostructure is substantially crystalline and comprises substantially a single crystal. When used with respect to a nanostructure heterostructure comprising a core and one or more shells, "monocrystalline" indicates that the core is substantially crystalline and comprises substantially a single crystal.

A "nanocrystal" is a nanostructure that is substantially monocrystalline. A nanocrystal thus has at least one region or characteristic dimension with a dimension of less than about 500 nm, e.g., less than about 200 nm, less than about 100 nm, less than about 50 nm, or even less than about 20 nm. The term "nanocrystal" is intended to encompass substantially monocrystalline nanostructures comprising various defects, stacking faults, atomic substitutions, and the like, as well as substantially monocrystalline nanostructures without such defects, faults, or substitutions. In the case of nanocrystal heterostructures comprising a core and one or more shells, the core of the nanocrystal is typically substantially monocrystalline, but the shell(s) need not be. In one aspect, each of the three dimensions of the nanocrystal has a dimension of less than about 500 nm, e.g., less than about 200 nm, less than about 100 nm, less than about 50 nm, or even less than about 20 nm. Examples of nanocrystals include, but are not limited to, substantially spherical nanocrystals, branched nanocrystals, and substantially monocrystalline nanowires, nanorods, nanodots, quantum dots, nanotetrapods, tripods, bipods, and branched tetrapods (e.g., inorganic dendrimers).

A "substantially spherical nanostructure" is a nanostructure with an aspect ratio between about 0.8 and about 1.2. For example, a "substantially spherical nanocrystal" is a nanocrystal with an aspect ratio between about 0.8 and about 1.2.

A "nanostructure array" is an assemblage of nanostructures. The assemblage can be spatially ordered (an "ordered array") or disordered (a "disordered array"). In a "monolayer array" of nanostructures, the assemblage of nanostructures comprises a monolayer.

A variety of additional terms are defined or otherwise characterized herein.

DETAILED DESCRIPTION

In one aspect, the invention provides methods for forming nanostructure arrays, e.g., ordered or disordered monolayer arrays of nanostructures. The arrays are optionally formed at predetermined positions and/or have predetermined dimensions. Devices related to the methods are also provided, as are devices including nanostructure arrays. For example, in one aspect, the invention provides memory devices including small monolayer arrays of nanostructures.

Monolayer Formation on Chemical Coatings

A surface on which a nanostructure array is to be formed can be coated with a chemical composition, e.g., a composition having a higher affinity for the nanostructures than the surface itself does. Such a coating can, e.g., facilitate adhesion of the nanostructures to the surface and can thus facilitate formation of the monolayer.

Thus, one general class of embodiments provides methods for forming a nanostructure array. In the methods, a first layer is provided and coated with a composition comprising a nanostructure association group, to provide a coated first layer. A population of nanostructures is deposited on the coated first layer, whereby the nanostructures associate with the nanostructure association group. Any nanostructures which are not associated with the nanostructure association group are removed, whereby a monolayer array of nanostructures remains associated with the coated first layer.

The first layer can comprise essentially any desired material, chosen, e.g., based on the use to which the resulting monolayer array of nanostructures is to be put (e.g., a conductive material, a nonconductive material, a semiconductor, or the like). The first layer is optionally disposed on a substrate, which can similarly comprise essentially any desired material, depending, e.g., on the desired use of the nanostructure array. Suitable substrates include, but are not limited to: a uniform substrate, e.g., a wafer of solid material, such as silicon or other semiconductor material, glass, quartz, polymerics, etc.; a large rigid sheet of solid material, e.g., glass, quartz, plastics such as polycarbonate, polystyrene, etc.; a flexible substrate, such as a roll of plastic such as polyolefin, polyamide, and others; or a transparent substrate. Combinations of these features can be employed. The substrate optionally includes other compositional or structural elements that are part of an ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

For example, in embodiments in which the monolayer array of nanostructures is to be incorporated into a flash transistor or memory device, the first layer comprises a dielectric material, such as an oxide (e.g., a metal oxide, silicon oxide, hafnium oxide, or alumina ($Al_2O_3$), or a combination of such oxides), a nitride (e.g., $Si_3N_4$), an insulating polymer, or another nonconductive material. In this class of embodiments, the first layer (which serves as a tunnel dielectric layer in these embodiments) is preferably thin (e.g., has a thickness of between about 1 nm and about 10 nm, e.g., between 3 and 4 nm), and is disposed on a substrate that comprises a semiconductor. The substrate typically includes a source region, a drain region, and a channel region between the source and drain regions and underlying the monolayer array of nanostructures, and the methods include disposing a control dielectric layer on the monolayer array of nanostructures and disposing a gate electrode on the control dielectric layer, thus incorporating the nanostructure array into a transistor. The control dielectric layer comprises a dielectric material, for example, an oxide (e.g., a metal oxide, $SiO_2$, or $Al_2O_3$, or a combination of such oxides), an insulating polymer, or another nonconductive material.

The methods can be used to form multiple nanostructure arrays on the same surface. Thus, in one class of embodiments, two or more discrete regions of the first layer are coated with the composition. Each region occupies a predetermined position on the first layer (which can, e.g., correspond to a predetermined position on a substrate on which the first layer is disposed). Two or more discrete monolayer arrays of nanostructures thus remain associated with the coated first layer after deposition of the population of nanostructures on the coated regions of the first layer and removal of nanostructures not associated with the nanostructure association group. Essentially any number of nanostructure arrays can be produced in this manner. For example, 10 or more, 50 or more, 100 or more, 1000 or more, $1 \times 10^4$ or more, $1 \times 10^6$ or more, $1 \times 10^9$ or more, $1 \times 10^{10}$ or more, $1 \times 10^{11}$ or more, or $1 \times 10^{12}$ or more discrete regions of the first layer can be coated with the composition, whereby 10 or more, 50 or more, 100 or more, 1000 or more, $1 \times 10^4$ or more, $1 \times 10^6$ or more, $1 \times 10^9$ or more, $1 \times 10^{10}$ or more, $1 \times 10^{11}$ or more, or $1 \times 10^{12}$ or more discrete monolayer nanostructure arrays are formed at predetermined positions on the first layer.

The regions can be of essentially any desired size. For example, each region (and thus each resulting monolayer array of nanostructures) can have an area of about $10^4 \, \mu m^2$ or less, about $10^3 \, \mu m^2$ or less, about $10^2 \, \mu m^2$ or less, about 10 $\mu m^2$ or less, about 1 $\mu m^2$ or less, about $10^5 \, nm^2$ or less, about $10^4 \, nm^2$ or less, or even about 4225 $nm^2$ or less, about 2025 $nm^2$ or less, about 1225 $nm^2$ or less, about 625 $nm^2$ or less, or about 324 $nm^2$ or less. It will be evident that each of the resulting arrays can, if desired, be incorporated into a transistor or other device.

Techniques useful for coating discrete regions of the first layer have been described in the art. For example, the first layer can be coated with resist (e.g., photoresist), which is exposed and developed in the desired pattern to uncover the desired regions of the first layer, which are then coated with the composition. As another example, the first layer can be coated with the composition, then with resist which is exposed and developed in the inverse of the desired pattern. Composition not protected by the resist is removed, and the remaining resist is removed to leave the composition in the desired regions. As yet another example, the composition can simply be printed on the first layer in desired regions. In another class of embodiments, the monolayer is formed and then patterned, e.g., using resist as described below in the section entitled "Patterning monolayers using resist."

As noted, the composition used to coat the first layer comprises a nanostructure association group (e.g., a chemical group that can interact, covalently or noncovalently, with a surface of a nanostructure and/or with a ligand coating a surface of a nanostructure). A large number of suitable groups are known in the art and can be adapted to the practice of the present invention. Exemplary nanostructure association groups include, but are not limited to, thiol, amine, alcohol, phosphonyl, carboxyl, boronyl, fluorine or other noncarbon heteroatom, phosphinyl, alkyl, aryl, and like groups.

In one class of embodiments, the composition comprises a silane. For example, the silane can be an organosilane, e.g., a trichlorosilane, trimethoxysilane, or triethoxysilane. As another example, the silane can include a structure having the formula [$X_3$Si-spacer-nanostructure association group(s)] where X is a Cl, OR, alkyl, aryl, other hydrocarbon, heteroatom, or a combination of these groups, and where the spacer is an alkyl, aryl and/or heteroatom combination. The silane can react with free hydroxyl groups on the surface of a silicon oxide first layer, for example, forming a monolayer coating on the first layer.

In one aspect, the nanostructure association group interacts with a surface of the nanostructures. In one exemplary class of embodiments, the nanostructure association group comprises a thiol group. The coated first layer can thus comprise, e.g., a self-assembled monolayer comprising a thiol compound. The composition can comprise, for example, a mercaptoalkyltrichlorosilane, a mercaptoalkyltrimethoxysilane, or a mercaptoalkyltriethoxysilane, e.g., in which the alkyl group comprises between 3 and 18 carbons (e.g., 12-mercaptododecyltrimethoxysilane). The composition optionally comprises a mixture of two or more different compounds. For example, the composition can include a mixture of a long chain mercaptosilane (e.g., a mercaptoalkyltrichlorosilane, a mercaptoalkyltrimethoxysilane, or a mercaptoalkyltriethoxysilane, where the alkyl group comprises between 8 and 18 carbons) and a short chain mercaptosilane (e.g., a mercaptoalkyltrichlorosilane, a mercaptoalkyltrimethoxysilane, or a mercaptoalkyltriethoxysilane, where the alkyl group comprises 8 or fewer carbons), where the alkyl group in the long chain mercaptosilane comprises at least one more carbon than does the alkyl group in the short chain mercaptosilane. In this example, the ratio of the long and short chain mercaptosilanes can be varied to tailor the surface presented to the nanostructures. For example, the long and short chain mercaptosilanes can be present at a molar ratio of between about 1:10 and about 1:10,000 long chain mercaptosilane to short chain mercaptosilane (e.g., a molar ratio of about 1:100 or 1:1000). As another example, the composition can include a mixture of a long chain mercaptosilane and a short chain silane which need not comprise a nanostructure association group (e.g., an alkyltrichlorosilane, alkyltrimethoxysilane, or alkyltriethoxysilane, where the alkyl group comprises 8 or fewer carbons).

Figure 3A:
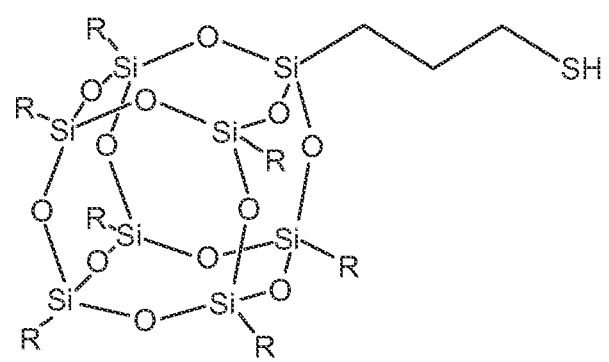
FIG. 3 Panel A depicts an exemplary monothiol silsesquioxane ligand, while Panel B depicts an exemplary trithiol silsesquioxane ligand. R can be an organic group or a hydrogen atom; for example, R can be a hydrocarbon group, an alkyl group (e.g., a cyclic alkyl group or a short alkyl group having fewer than 20 or even fewer than 10 carbon atoms), an aryl group, an alkylaryl group, an alkenyl group, or an alkynyl group. For example, in some embodiments, R is an isobutyl group, a methyl group, a hexyl group, or a cyclopentyl group. In certain embodiments, R is a cyclohexyl group.
Figure 3B:
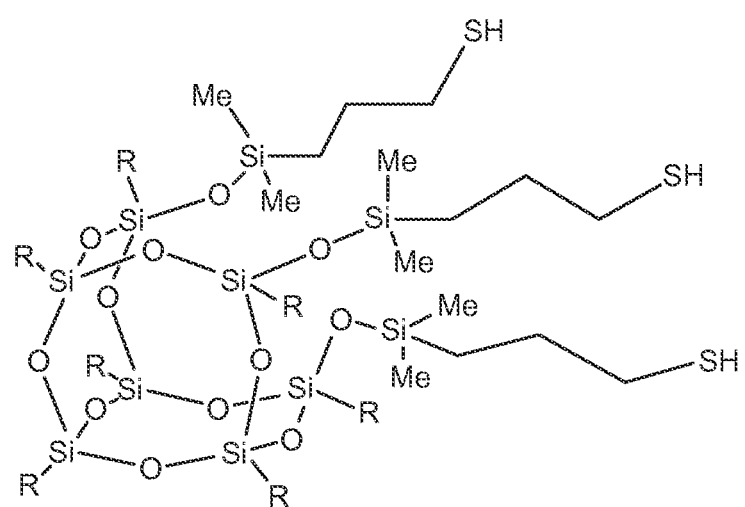

The nanostructures are optionally associated with a surfactant or other surface ligand. In one class of embodiments, each of the nanostructures comprises a coating comprising a ligand associated with a surface of the nanostructure, for example, a silsesquioxane ligand such as those described in Whiteford et al. U.S. Provisional Patent Application Ser. No. 60/632,570, filed Nov. 30, 2004, or illustrated in FIG. 3. The ligands optionally control spacing between adjacent nanostructures in an array. The nanostructure association group can displace the ligand and/or can intercalate between adjacent ligand molecules to reach the surface of the nanostructures.

An exemplary embodiment is schematically illustrated in FIG. 1. In this example, first layer 103 (e.g., a layer of $SiO_2$) is disposed on substrate 120 (e.g., a silicon substrate). The first layer as depicted is continuously distributed across the substrate, but it will be evident that the first layer can optionally instead be disposed in multiple discrete regions on the substrate. The first layer is coated with composition 104 (e.g., a mixture of long and short chain mercaptosilanes) including nanostructure association group 105 (e.g., a thiol group), to form coated first layer 102 in discrete regions 119. A population of nanostructures 110 (e.g., Pd quantum dots) coated with ligand 111 (e.g., a silsesquioxane ligand) is deposited on the coated first layer, e.g., by spin coating (Panel A). Nanostructures associate with the nanostructure association group, which intercalates among the ligand coating the nanostructures, and form slightly more than a monolayer on the first layer (Panel B). Nanostructures that are not associated with the nanostructure association group are removed (e.g., by washing with a solvent) to leave monolayer arrays 109 of nanostructures associated with the coated first layer (Panel C).

Instead of (or in addition to) displacing or intercalating with the ligand on the nanostructures to interact with the nanostructure surface, the nanostructure association group can interact with the ligand. Thus, in one aspect, each of the nanostructures comprises a coating comprising a ligand associated with a surface of the nanostructure, and the nanostructure association group interacts with the ligand. In some embodiments, the ligand comprises a silsesquioxane. Exemplary ligands include, but are not limited to, those described in U.S. Provisional Patent Application Ser. No. 60/632,570 (supra) or illustrated in FIG. 3.

The interaction between the ligand and the nanostructure association group can be covalent or noncovalent. Thus, in one class of embodiments, the interaction is noncovalent. The composition can comprise, for example, 3-aminopropyltriethoxysilane (APTES), dodecyltrichlorosilane, octadecyltrichlorosilane (OTS), dodecyltriethoxysilane, octadecyltriethoxysilane, or any of a number of similar compounds. As noted above, the silanes can, e.g., bind to free hydroxyl groups on the surface of an $SiO_2$ first layer. The dodecyl and octadecyl groups provide a hydrophobic surface, e.g., for interaction with a hydrophobic ligand on the nanostructures, while APTES provides a polar surface, e.g., for interaction with a ligand that can hydrogen bond with the APTES amino groups.

In another class of embodiments, the nanostructure association group forms a covalent bond with the ligand. The composition is optionally photoactivatable, such that the covalent bond between the ligand and the nanostructure association group is formed only upon exposure to light. In such embodiments, the methods include exposing one or more discrete regions of the coated first layer, each of which occupies a predetermined position on the coated first layer, to light.

Essentially any number of nanostructure arrays can be produced in this manner. For example, two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete regions of the coated first layer can be exposed to the light, resulting in formation of a like number of discrete nanostructure monolayer arrays at predetermined positions on the first layer (and thus, at predetermined positions on any substrate on which the first layer is disposed). Similarly, the regions can be of essentially any desired size. For example, each region (and thus each resulting monolayer array of nanostructures) can have an area of about $10^4$ $\mu m^2$ or less, about $10^3$ $\mu m^2$ or less, about $10^2$ $\mu m^2$ or less, about 10 $\mu m^2$ or less, about 1 $\mu m^2$ or less, about $10^5$ $nm^2$ or less, about $10^4$ $nm^2$ or less, or even about 4225 $nm^2$ or less, about 2025 nm² or less, about 1225 nm² or less, about 625 nm² or less, or about 324 nm² or less. It will be evident that each of the resulting arrays can, if desired, be incorporated into a transistor or other device. Using a photoactivatable composition thus provides a convenient means of patterning, such that a desired number, size, and/or shape of monolayer nanostructure array(s) can be produced.

A large number of photoactivatable compounds are known in the art and can be adapted to the practice of the present invention. For example, the composition can include a phenyl azide group, which when photoactivated can form a covalent bond with, e.g., a silsesquioxane ligand comprising a coating associated with a surface of the nanostructures. Exemplary photoactivatable compositions include, but are not limited to, compounds comprising an aryl azide group (e.g., a phenyl azide, hydroxyphenyl azide, or nitrophenyl azide group), a psoralen, or a diene.

The composition can be applied to form the coating in one or more steps. For example, in certain embodiments, coating the first layer with the composition involves coating the first layer with a first compound and then coating the first layer with a second compound which interacts with the first compound and which includes the nanostructure association group. For example, the first layer (e.g., an $SiO_2$ first layer) can be coated with 3-aminopropyltriethoxysilane (APTES) as the first compound and then with N-5-azido-2-nitrobenzoyloxysuccinimide (ANB-NOS) as the second compound. (ANB-NOS has an amine-reactive N-hydroxysuccinimide ester group, which reacts with the APTES amino groups, and a nitrophenyl azide group, which can be photolyzed, e.g., at 320-350 nm.)

Figure 2:
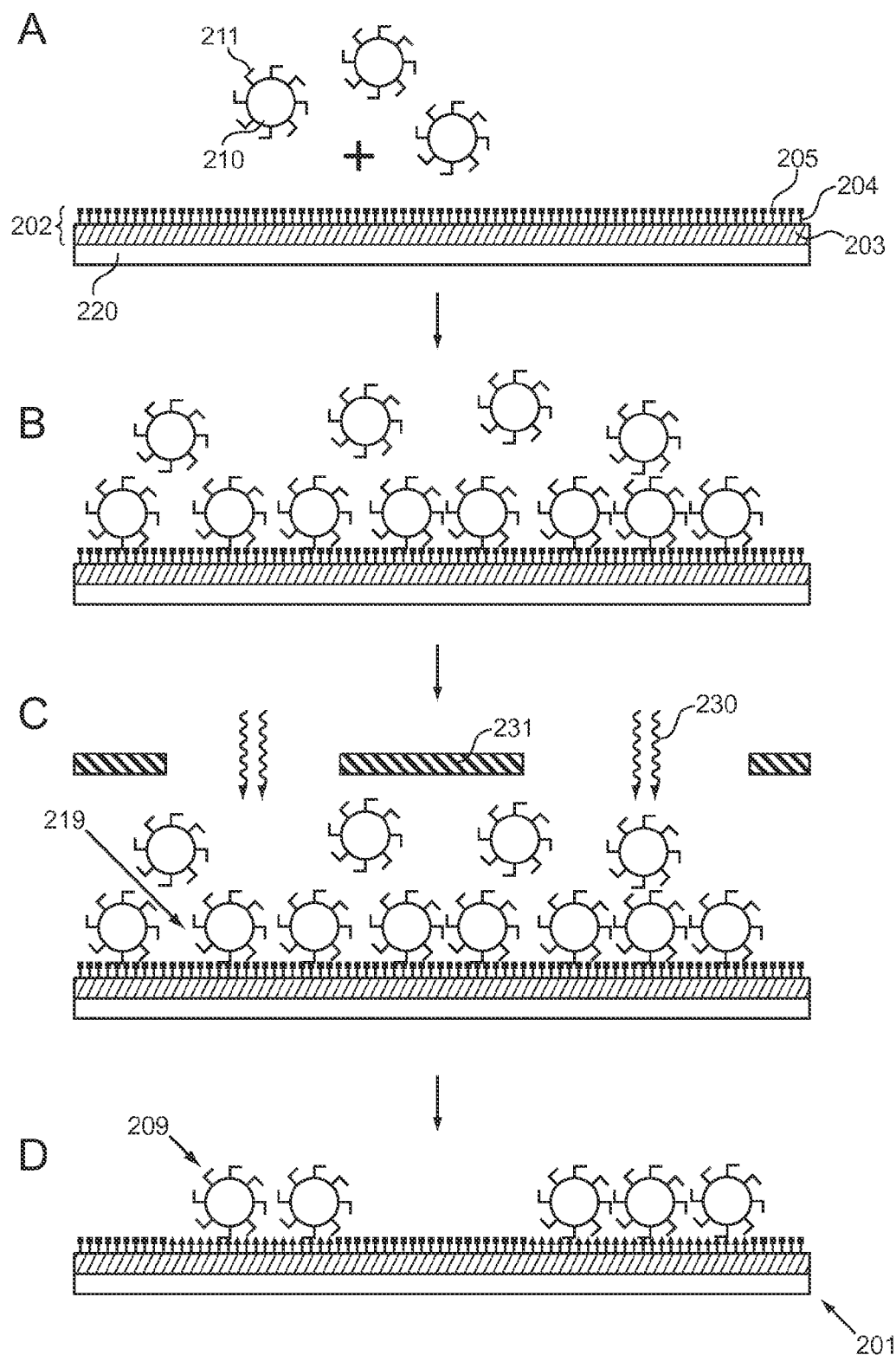
FIG. 2 Panels A-D schematically illustrate formation of monolayer arrays of nanostructures on a coated first layer, where the coating composition is photoactivatable and discrete regions of the first layer are exposed to light to initiate cross-linking of the composition to ligands on the nanostructures.

An exemplary embodiment is schematically illustrated in FIG. 2. In this example, first layer 203 (e.g., a layer of $SiO_2$) is disposed on substrate 220 (e.g., a silicon substrate). The first layer is coated with composition 204 (e.g., APTES and ANB-NOS), which includes photoactivatable nanostructure association group 205 (e.g., a phenyl azide group), to form coated first layer 202 (Panel A). A population of nanostructures 210 (e.g., Pd quantum dots) coated with ligand 211 (e.g., a silsesquioxane ligand) is deposited on the coated first layer, e.g., by spin coating to form slightly more than a monolayer (Panel B). Discrete regions 219 of the coated first layer are exposed to light 230, while the remainder of the coated first layer is protected from exposure to the light by mask 231 (Panel C). Nanostructures that are not covalently bonded to the nanostructure association group are removed (e.g., by washing with a solvent, e.g., hexane) to leave monolayer arrays 209 of nanostructures associated with the coated first layer (Panel D).

In one class of embodiments, the population of nanostructures is deposited on the coated first layer by depositing a solution comprising the nanostructures dispersed in at least one solvent on the coated first layer. The solution of nanostructures can be deposited by essentially any convenient technique, for example, spin coating, dip coating, soaking, spraying, or similar techniques. The solvent can, but need not be, partially or completely removed from the deposited nanostructures, e.g., by evaporation. Any nanostructures which are not associated with the nanostructure association group can be conveniently removed, e.g., by washing with at least one solvent.

In one aspect, the monolayer array (or each of multiple arrays) of nanostructures formed by the methods comprises an ordered array, e.g., a hexagonal-close packed monolayer array comprising substantially spherical nanocrystals or a square array comprising cubic nanocrystals. For many applications, however, an ordered array is not required. For example, for an array for use in a memory device, the nanostructures need not be ordered in the array as long as they achieve sufficient density in a disordered array. Thus, in another aspect, the monolayer array of nanostructures comprises a disordered array.

In one class of embodiments, the array (or each of multiple arrays produced by the methods) has a high density of nanostructures. For example, the monolayer array of nanostructures optionally has a density greater than about $1\times10^{10}$ nanostructures/cm², greater than about $1\times10^{11}$ nanostructures/cm², greater than about $1\times10^{12}$ nanostructures/cm², or even greater than about $1\times10^{13}$ nanostructures/cm².

In one class of embodiments, the nanostructures comprise substantially spherical nanostructures or quantum dots. The nanostructures can comprise essentially any desired material, chosen, e.g., based on the use to which the resulting monolayer array of nanostructures is to be put. For example, the nanostructures can comprise a conductive material, a nonconductive material, a semiconductor, and/or the like. In one aspect, the nanostructures have a work function of about 4.5 eV or higher. Such nanostructures are useful, for example, in fabrication of memory devices, where if the work function of the nanostructures is not sufficiently high, electrons stored in the nanostructures tend to travel back across the tunnel dielectric layer, resulting in memory loss. Thus, the nanostructures (e.g., the substantially spherical nanostructures or quantum dots) optionally comprise materials such as palladium (Pd), iridium (Ir), nickel (Ni), platinum (Pt), gold (Au), ruthenium (Ru), cobalt (Co), tungsten (W), tellurium (Te), iron platinum alloy (FePt), or the like. Nanostructures are described in greater detail below in the section entitled "Nanostructures".

Devices produced by or useful in practicing the methods of the invention are also a feature of the invention. Thus, another general class of embodiments provides a device including a coated first layer and a monolayer array of nanostructures disposed on the coated first layer. The coated first layer includes a first layer coated with a composition comprising a nanostructure association group, and the nanostructures are associated with the nanostructure association group.

Essentially all of the features noted for the methods above apply to these embodiments as well, as relevant; for example, with respect to composition of the first layer, substrate, composition used to coat the first layer, nanostructure association group, and nanostructures. It is worth noting that the monolayer array of nanostructures can comprise an ordered array or a disordered array, and that the coated first layer optionally comprises two or more discrete regions, each of which occupies a predetermined position (so the device optionally includes two or more monolayer arrays of nanostructures disposed on the coated first layer). It is also worth noting that the device optionally comprises a flash transistor (floating gate memory MOSFET) or memory device. Thus, in certain embodiments, the first layer comprises a dielectric material, such as an oxide (e.g., a metal oxide, silicon oxide, hafnium oxide, or alumina ($Al_2O_3$)), a nitride, an insulating polymer, or another nonconductive material. In this class of embodiments, the first layer (which serves as a tunnel dielectric layer) is preferably thin (e.g., has a thickness of between about 1 nm and about 10 nm, e.g., between 3 and 4 nm), and is disposed on a substrate that comprises a semiconductor (e.g., a Si substrate). The substrate typically includes a source region, a drain region, and a channel region between the source and drain regions and underlying the monolayer array of nanostructures. A control dielectric layer is disposed on the monolayer array of nanostructures, and a gate electrode is disposed on the control dielectric layer. The control dielectric layer comprises a dielectric material, e.g., an oxide (e.g., a metal oxide, SiO$_2$, or Al$_2$O$_3$), an insulating polymer, or another nonconductive material. The electrodes can comprise essentially any suitable material(s). For example, the gate electrode can comprise polysilicon, a metal silicide (e.g., nickel silicide or tungsten silicide), ruthenium, ruthenium oxide, or Cr/Au. Similarly, the source and drain electrodes optionally comprise a metal silicide (e.g., nickel silicide or tungsten silicide) or any of various barrier metals or metal nitrides such as TiN, connecting to other metals such as copper or aluminum.

An exemplary embodiment is schematically illustrated in FIG. 1 Panel C. In this example, device 101 includes coated first layer 102 and monolayer arrays 109 of nanostructures 110 disposed on the coated first layer in discrete regions 119. Coated first layer 102 includes first layer 103 coated with composition 104 including nanostructure association group 105. The first layer is disposed on substrate 120.

A related exemplary embodiment is schematically illustrated in FIG. 2 Panel D. In this example, device 201 includes coated first layer 202 and monolayer arrays 209 of nanostructures 210 disposed on the coated first layer in discrete regions 219. Coated first layer 202 includes first layer 203 coated with composition 204 including nanostructure association group 205. The first layer is disposed on substrate 220. In this embodiment, nanostructure association group 205 is covalently bonded to ligand 211 on the nanostructures.

Monolayer Formation in Spin-on-Dielectrics

As noted above, nanostructure monolayers are desirable for a number of applications. For example, formation of quantum dot monolayers on tunnel oxides is desirable for production of nanocrystal flash memory devices. Because the performance of nanocrystal based flash memory devices (or other nanostructure-based devices) can be determined at least in part by variations in nanostructure density, high density monolayers with low nanostructure density variations are desired. However, since imperfect size distribution of the nanodots affects coherent length of self-assembly, simply coating a substrate with dots (e.g., a substrate whose surface is not modified with a composition that includes a nanostructure association group and where the dots are not dispersed in a matrix material, etc.) typically results in localized dot assemblies with grain boundary formed among them. Since the coherent self-assembly length depends on the size distribution of the dots, the quality of the assembly process has been limited by the size distribution of the dots and it has been challenging to improve the quality of the resulting assemblies. Solution phase chemistry usually provides size distributions of less than 10%, while the conventional CVD and PVD approaches provide grain distributions of about 20% to 25%.

One aspect of the invention provides methods that facilitate randomized assembly of nanostructures (e.g., quantum dots) without grain boundary formation by using spin-on-dielectric materials. The nanostructures are dispersed well in a solution in the presence of a spin-on-dielectric (e.g., spin-on-glass) material. When the nanostructure solution is spun onto a substrate, the nanostructures form a randomized monolayer assembly in the spin-on-dielectric material. The spin-on-dielectric material forms a matrix on the substrate after the coating process; the nanostructures are randomly distributed in the matrix. The nanostructure density in the resulting array is controlled by their concentration in the solution. Variation in nanostructure density across the resulting monolayer is minimal.

Accordingly, one general class of embodiments provides methods for forming a nanostructure array. In the methods, a first layer is provided, as are nanostructures dispersed in a solution comprising a liquid form of a spin-on-dielectric. The solution is disposed on the first layer, whereby the nanostructures form a monolayer array on the first layer. The liquid form of the spin-on-dielectric is then cured to provide a solid form of the spin-on-dielectric. The monolayer array of nanostructures is embedded in the resulting solid spin-on-dielectric matrix.

Suitable materials for the first layer have been described above. The first layer is optionally treated prior to disposition of the solution. For example, the first layer can be coated with hexamethyldisilizane (HMDS) or a silane before the solution is disposed on it.

The solution including the nanostructures and the liquid spin-on-dielectric can be disposed on the first layer by essentially any convenient technique. For example, the first layer can be spin coated with the solution.

A large number of spin-on-dielectric materials are known in the art and can be adapted to the methods. As just a few examples, the solid form of the spin-on-dielectric can comprise silicon oxide, aluminum oxide, hafnium oxide (e.g., HfO$_2$), lanthanum oxide (e.g., La$_2$O$_3$), or tantalum oxide (e.g., Ta$_2$O$_5$). Similarly, the liquid form of the spin-on-dielectric can comprise aluminum i-propoxide (Al i-propoxide), tri-methyl aluminum, tri-ethyl aluminum, hafnium t-butoxide (Hf t-butoxide), hafnium ethoxide (Hf ethoxide), tetrabenzyl hafnium (tetrabenzyl Hf), tris(cyclopentadienyl)lanthanum, tris(i-propylcyclopentadienyl)lanthanum, pentakis(dimethylamino)tantalum, tantalum methoxide (Ta methoxide), or tantalum ethoxide (Ta ethoxide). As noted herein, the solid form of the spin-on-dielectric optionally serves as a diffusion barrier.

In one class of embodiments, the spin-on-dielectric is a spin-on-glass. The liquid form of the spin-on-glass can comprise a silicon compound that forms a silicon oxide (e.g., SiO$_2$) after curing. For example, the liquid form of the spin-on-glass can include a silsesquioxane, e.g., mercapto-propyl-cyclohexyl polyhedral oligomeric silsesquioxane (see FIG. 3 Panel A, where R is a cyclohexyl group), hydrogen silsesquioxane, octavinyl dimethyl silyl silsesquioxane, octasilane silsesquioxane, or octavinyl-T8 silsesquioxane, or a combination thereof (e.g., a combination of silsesquioxanes with and without a nanostructure binding moiety that can bind to the surface of the nanostructures, e.g., a mixture of mercapto-propyl-cyclohexyl POSS and hydrogen silsesquioxane). A variety of such silsesquioxanes are known in the art, and a number are commercially available, e.g., from Gelest, Inc. Other types of spin-on-glass materials can also be used. Preferred spin-on-glass or spin-on-dielectric materials are ones which dissolve well in the solvent for the nanostructures and produce good wetting behavior on the relevant surface (e.g., on an HMDS modified tunnel oxide layer).

The spin-on-dielectric material can be cured as is known in the art, for example, by UV, electron beam, heat, or the like. In one class of embodiments, the liquid form of the spin-on-dielectric comprises a photopolymerizable compound (e.g., hydrogen silsesquioxane or octavinyl-T8 silsesquioxane or another photopolymerizable silsesquioxane or silicate). Use of a photopolymerizable spin-on-dielectric facilitates patterning of the monolayer array, as described in greater detail below in the section entitled "Patterning monolayers using resist." In brief, to pattern the array, a predetermined pattern is exposed to light to cure the spin-on-dielectric, and uncured material along with its embedded nanostructures is removed.

Thus, in one class of embodiments, at least a first region of the first layer and the solution disposed thereon are exposed to light of an appropriate wavelength, thereby curing the spin-on-dielectric in the first region. Simultaneously, at least a second region of the first layer and the solution disposed thereon are protected from the light, whereby the spin-on-dielectric in the second region remains uncured. The uncured spin-on-dielectric and the nanostructures therein are then removed from the first layer without removing the cured spin-on-dielectric and the nanostructures therein, leaving one or more monolayer arrays on the first layer. The position and size of the array(s) in the cured spin-on-dielectric matrix correspond to that of the first region(s).

The methods can be used to produce essentially any number of monolayer arrays. For example, two or more, 10 or more, 50 or more, 100 or more, 1000 or more, $1\times10^4$ or more, $1\times10^6$ or more, $1\times10^9$ or more, or even $1\times10^{12}$ or more discrete regions of the first layer and the solution disposed thereon can be exposed to the light, such that a like number of discrete nanostructure monolayer arrays remains on the first layer.

Similarly, if such patterning is desired when the spin-on-dielectric is not conveniently photopolymerizable, a photoresist (e.g., any well-established photoresist) can be included in the solution with the nanostructures and the liquid form of the spin-on-dielectric. The percentage of the various components are adjusted as desired, e.g., to provide adequate photo-curing of the matrix and a good dielectric after curing.

The monolayer array of nanostructures is typically a disordered array. The array (or each of multiple arrays) produced by the methods optionally has a high density of nanostructures. For example, the monolayer array of nanostructures optionally has a density greater than about $1\times10^{10}$ nanostructures/cm$^2$, greater than about $1\times10^{11}$ nanostructures/cm$^2$, greater than about $1\times10^{12}$ nanostructures/cm$^2$, or even greater than about $1\times10^{13}$ nanostructures/cm$^2$. As noted, variation in the density of the nanostructures across the array (or over large areas of the array, e.g., areas 2-3 micrometers on a side) is preferably low. For example, variation in density of the nanostructures in the monolayer array can be less than 10% across the monolayer, e.g., less than 5%.

Essentially all of the features noted for the embodiments above apply to these embodiments as well, as relevant; for example, with respect to disposition of the first layer on a substrate, composition of the substrate, incorporation of the array(s) into transistor(s), nanostructure shape and composition, nanostructure ligands, size of the array(s), and the like. For example, the nanostructures are optionally substantially spherical nanostructures or quantum dots. The nanostructures can comprise essentially any desired material. In one class of embodiments, the nanostructures have a work function of about 4.5 eV or higher. For example, the nanostructures can comprise palladium, nickel, or ruthenium.

Figure 8B:
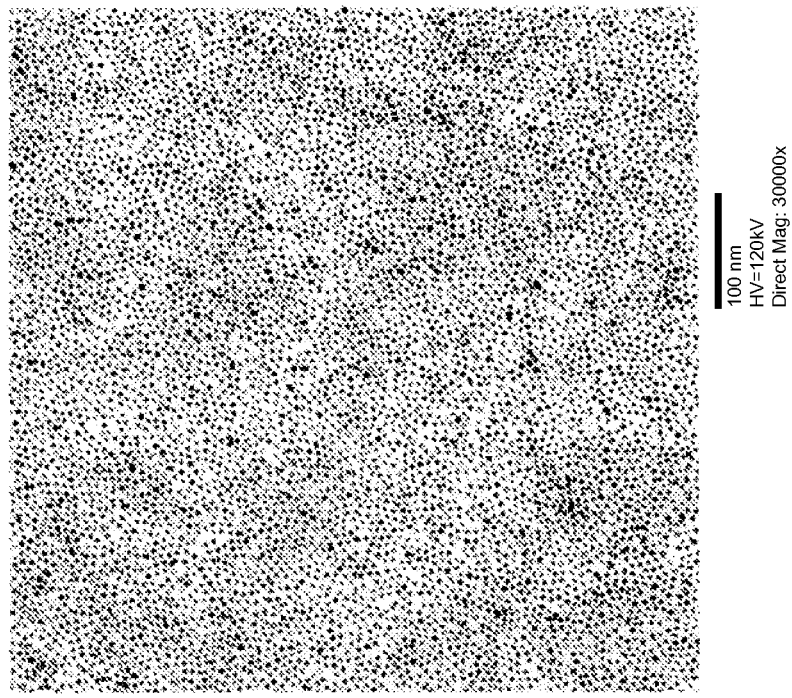
FIG. 8 presents micrographs of palladium (Panel A), ruthenium (Panel B), and nickel (Panel C) quantum dots formed by deposition of the dots in a spin-on-glass.
Figure 8A:
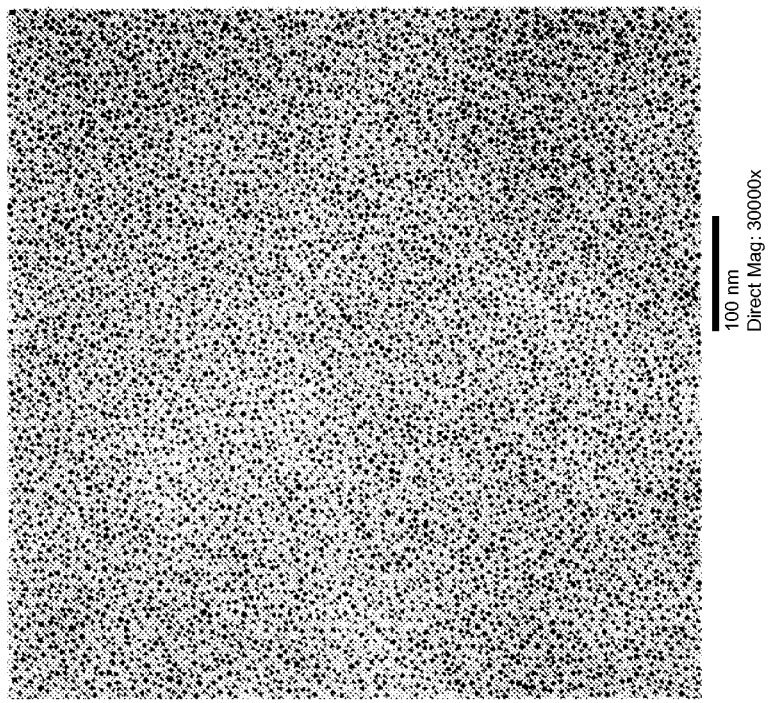
Figure 8C:
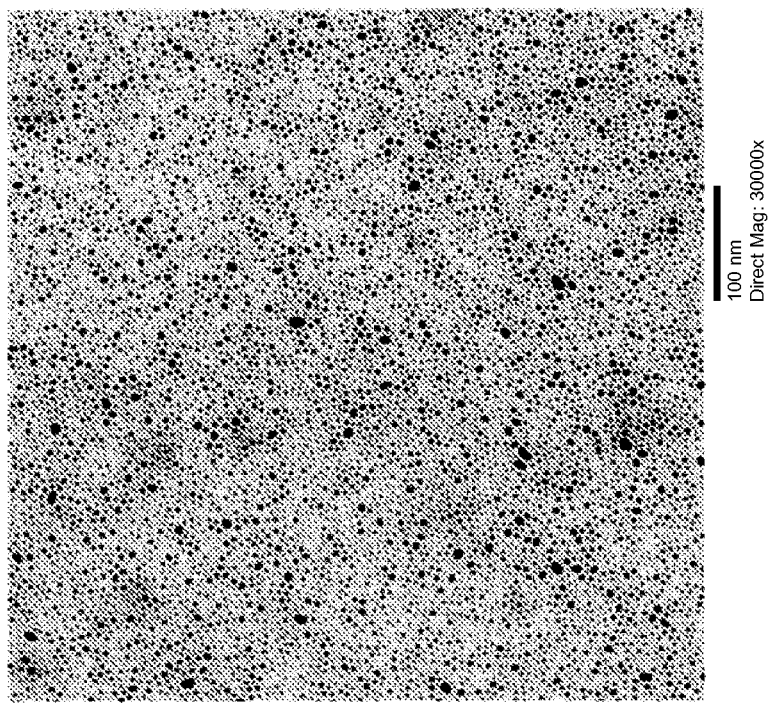

Monolayer formation of Pd, Ru, and Ni quantum dots is illustrated in FIG. 8 Panels A-C, respectively. In these examples, the substrate was coated with HMDS, and mercapto-propyl-cyclohexyl polyhedral oligomeric silsesquioxane (3.5 mg/ml in chlorobenzene or xylene) was used as the spin-on-glass material. In these examples, a silicon nitride membrane was used as the substrate; other exemplary substrates include, e.g., an SiO$_2$ wafer or oxynitride substrate. The silsesquioxane was cured in an O$_2$, CDA environment, by ramping to 300-400° C. and dwelling at the high temperature for 5-30 minutes.

As noted, devices produced by or useful in practicing the methods of the invention are also a feature of the invention. Thus, another general class of embodiments provides a device including a first layer, a liquid or solid form of a spin-on-dielectric disposed on the first layer, and a monolayer of nanostructures disposed on the first layer in the spin-on-dielectric.

Essentially all of the features noted for the methods above apply to these embodiments as well, as relevant; for example, with respect to composition of the liquid and/or solid form of the spin-on-dielectric, first layer, substrate, and nanostructures. It is worth noting that the monolayer of nanostructures is typically a disordered monolayer, and that the device optionally comprises two or more discrete monolayer arrays embedded in the solid form of the spin-on-dielectric, each of which typically occupies a predetermined position. It is also worth noting that the device optionally comprises a flash transistor (floating gate memory MOSFET) or memory device. Thus, in certain embodiments, the first layer comprises a dielectric material, such as an oxide (e.g., a metal oxide, silicon oxide, hafnium oxide, or alumina (Al$_2$O$_3$)), a nitride, an insulating polymer, or another nonconductive material. In this class of embodiments, the first layer (which serves as a tunnel dielectric layer) is preferably thin (e.g., has a thickness of between about 1 nm and about 10 nm, e.g., between 3 and 4 nm), and is disposed on a substrate that comprises a semiconductor (e.g., a Si substrate). The substrate typically includes a source region, a drain region, and a channel region between the source and drain regions and underlying the monolayer array of nanostructures. A control dielectric layer is disposed on the monolayer of nanostructures in the spin-on-dielectric, if needed, and a gate electrode is disposed on the control dielectric layer. The control dielectric layer comprises a dielectric material, e.g., an oxide (e.g., a metal oxide, SiO$_2$, or Al$_2$O$_3$), an insulating polymer, or another nonconductive material. The electrodes can comprise essentially any suitable material(s). For example, the gate electrode can comprise polysilicon, a metal silicide (e.g., nickel silicide or tungsten silicide), ruthenium, ruthenium oxide, or Cr/Au. Similarly, the source and drain electrodes optionally comprise a metal silicide (e.g., nickel silicide or tungsten silicide) or any of various barrier metals or metal nitrides such as TiN, connecting to other metals such as copper or aluminum.

Solvent Annealing

One aspect of the invention provides solvent annealing methods that can be used to improve monolayer quality. Quantum dots or other nanostructures are deposited on a surface, and solvent annealing is then employed: the nanostructures are exposed to solvent vapor, introducing some short-range mobility to the nanostructures on the surface and thus allowing monolayer assembly quality to improve.

Accordingly, one general class of embodiments provides methods for forming a nanostructure array. In the methods, a first layer is provided and a population of nanostructures is deposited on the first layer. The nanostructures deposited on the first layer are exposed to extrinsic solvent vapor, whereby the nanostructures assemble into a monolayer array.

To expose the nanostructures on the first layer to the solvent vapor, a first solvent can be provided in liquid form (e.g., in a reservoir physically distinct from the first layer). The first layer bearing the nanostructures is typically placed in a container, e.g., a closed container, with the liquid first solvent. The first solvent (and the first layer) can be maintained at ambient temperature, but optionally the first solvent is heated, e.g., to a temperature sufficient to vaporize at least a portion of the solvent. For example, the first solvent can be heated to a temperature greater than 30° C., greater than 50° C., greater than 70° C., or greater than 90° C. Preferably, this temperature is less than the boiling point of the solvent and is not so high as to result in fusion of the nanostructures with each other. It will be evident that heating can both vaporize the solvent and permit the nanostructures on the surface to have greater mobility. The selected temperature is maintained for a sufficient time to permit monolayer formation. The first solvent is preferably one in which the nanostructures disperse well and that wets the first layer well. Suitable solvents include, but are not limited to, hexane, octane, xylene, chlorobenzene, methyl-isobutylketone (MIBK), and volatile siloxanes.

The nanostructures can be deposited on the first layer by dispersing them in a solution comprising at least one second solvent and disposing the resulting solution on the first layer. The solution comprising the nanostructures can be applied to the first layer by essentially any technique known in the art, for example, spray coating, flow coating, capillary coating, dip coating, roll coating, ink-jet printing, spin coating, or other wet coating techniques. Optionally, the solution is disposed on the first layer by a technique other than spin coating. The second solvent in which the nanostructures are dispersed can be the same as or different from the first solvent to whose vapor the nanostructures are exposed after deposition on the first layer.

The nanostructures are optionally substantially dry when exposed to the solvent vapor. Thus, in one class of embodiments, the methods include evaporating the second solvent in which the nanostructures were dispersed to provide dry nanostructures deposited on the first layer, after disposing the solution on the first layer and prior to exposing the nanostructures to the solvent vapor. The dry nanostructures deposited on the first layer are optionally exposed to air or to a selected atmosphere (e.g., an oxygen-containing atmosphere, $N_2$, CDA (compressed dry air), or the like), typically at ambient temperature, prior to exposing the nanostructures to the solvent vapor.

In another class of embodiments, the nanostructures are still wet with the second solvent when they are exposed to the solvent vapor. For example, a thin film of second solvent can be permitted to remain on the first layer surrounding the nanostructures. In these embodiments, exposure to the solvent vapor of the first solvent decreases the evaporation rate of the second solvent from the surface, facilitating assembly of the nanostructures.

The solvent vapor is extrinsically supplied, and thus arises from a source of first solvent extrinsic to the nanostructures and typically the first layer. For example, the solvent vapor does not arise from a film of second solvent remaining on the first layer and surrounding the nanostructures.

In one class of embodiments, the number of nanostructures applied to the first layer is substantially equal to the number of nanostructures desired in the resulting monolayer array. Since excess nanostructures need not be applied, a washing step to remove excess nanostructures after monolayer formation is not required.

As for the other embodiments described herein, the first layer can comprise essentially any desired material, e.g., a conductive material, a nonconductive material, a semiconductor, or the like, including, for example, a silicon wafer or a flexible material such as a plastic. The first layer optionally comprises a dielectric material such as an oxide or nitride, e.g., silicon oxide, hafnium oxide, alumina, or silicon nitride, and is optionally disposed on a substrate (in embodiments in which it is not serving as a substrate).

The first layer can be modified before deposition of the nanostructures, for example, with a compound that forms a self-assembled monolayer. Exemplary compounds include, but are not limited to, a mercaptosilane, APTES, OTS, and HMDS.

The resulting monolayer array of nanostructures can comprise an ordered array or a disordered array. The array optionally has a density greater than about $1 \times 10^{10}$ nanostructures/$cm^2$, greater than about $1 \times 10^{11}$ nanostructures/$cm^2$, greater than about $1 \times 10^{12}$ nanostructures/$cm^2$ (e.g., $3\text{-}4 \times 10^{12}$ nanostructures/$cm^2$), or greater than about $1 \times 10^{13}$ nanostructures/$cm^2$.

Essentially all of the features noted for the embodiments above apply to these embodiments as well, as relevant; for example, with respect to incorporation of the array(s) into transistor(s), nanostructure shape and composition, nanostructure ligands, size of the array(s), and the like. For example, the nanostructures are optionally substantially spherical nanostructures or quantum dots. The nanostructures can comprise essentially any desired material. In one class of embodiments, the nanostructures have a work function of about 4.5 eV or higher.

Figure 9B:
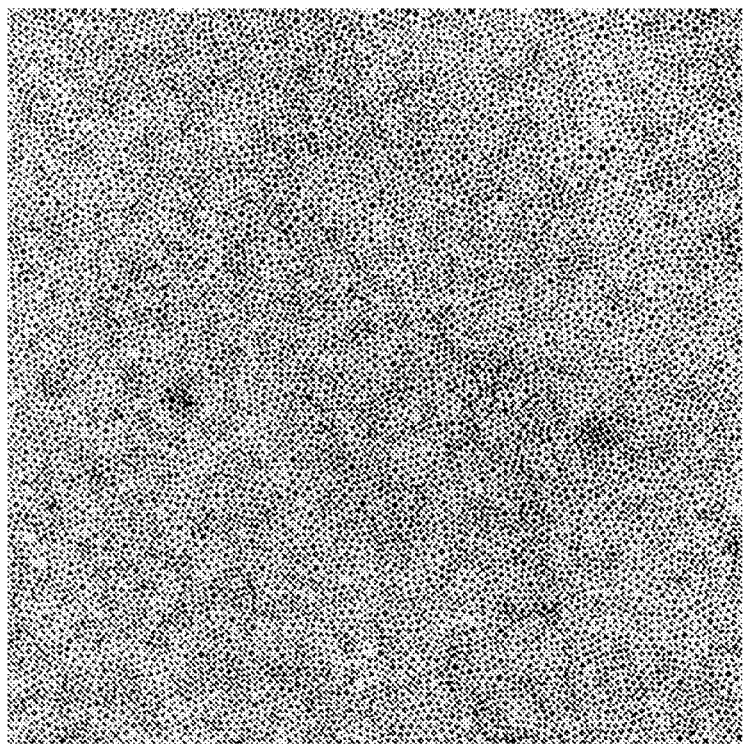
FIG. 9 presents micrographs of quantum dots before (Panel A) and after (Panel B) solvent annealing to improve monolayer quality.
Figure 9A:
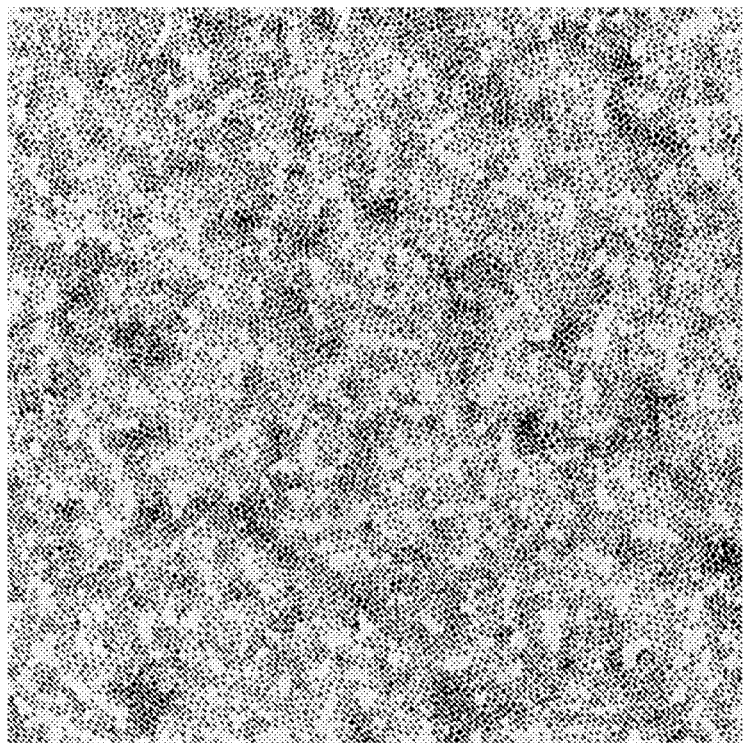

FIG. 9 presents micrographs of Pd quantum dots deposited on low stress silicon nitride before (Panel A) and after (Panel B) solvent annealing. In this example, chlorobenzene is utilized as the annealing solvent. The solvent is heated to 110° C. for 12 hours, during which the dots on substrate are exposed to the chlorobenzene vapor. The solvent annealing process decreased the percentage of multi-layer regions and improved the assembly quality.

Monolayer formation is, as noted above, an important step in fabricating any of a number of nanostructure-based devices, including quantum dot-based devices. Current techniques for forming quantum dot monolayers typically use an excess of the dots. For example, when a wafer is spin coated with quantum dots, most of the dots are spun away into the chemical drain (typically, more than 95% of the dots). These excess dots cannot generally be recovered for reuse due to concerns about contamination and quality control. Techniques that minimize dot consumption are thus desirable, particularly for mass production of nanostructure devices.

One aspect of the invention provides methods that facilitate monolayer formation while optionally minimizing consumption of nanostructures. The surface of interest (e.g., a wafer) is coated with quantum dots or other nanostructures. The surface can be spin-coated with dots, or optionally the dots can be applied to the surface with a non-spinning technique. The dots can be applied to the surface in an amount calculated to produce a desired density when the dots are in a monolayer on the surface. To obtain a high-quality monolayer, solvent annealing is employed after deposition of the dots: the dots are exposed to solvent vapor, giving them short-range mobility and permitting them to move from multi-layer regions to form a monolayer.

Patterning Monolayers Using Resist

Certain methods described above permit the size, shape, and/or position of resultant monolayer nanostructure arrays to be predetermined. Use of resist, e.g., photoresist, can also facilitate such patterning of monolayer arrays.

One general class of embodiments provides methods for patterning a nanostructure monolayer. In the methods, a monolayer of nanostructures disposed on a first layer is provided. Resist is disposed on the monolayer of nanostructures to provide a resist layer, and a predetermined pattern on the resist layer is exposed (e.g., to light, an electron beam, x-rays, etc.), to provide exposed resist in at least a first region of the resist layer and unexposed resist in at least a second region of the resist layer. If a positive resist is utilized, the exposed resist and its underlying nanostructures are removed, and then the unexposed resist is removed without removing its underlying nanostructures from the first layer. If instead a negative resist is utilized, the unexposed resist and its underlying nanostructures are removed, and then the exposed resist is removed without removing its underlying nanostructures. Whether positive or negative resist is used, at least one nanostructure monolayer array defined by the first region remains on the first layer. It will be evident that if a positive resist is used, the position of the array corresponds to that of the second region (i.e., the inverse of the first region), while if a negative resist is used, the position of the array corresponds to that of the first region. The boundaries of the nanostructure monolayer array are thus defined by the boundaries of the first region.

The monolayer of nanostructures can be produced by any convenient technique. For example, the first layer can be spin coated with a solution of nanostructures, and any nanostructures which are not in contact with the first layer can then be removed, e.g., by washing. Monolayers can also be formed, e.g., by soaking or dip coating the first layer or by using a commercially available Langmuir-Blodgett device.

The first layer can, but need not, include a coating comprising a nanostructure association group such as those described above, e.g., to increase adherence of the nanostructures to the first layer. Similarly, the nanostructures optionally comprise a ligand such as those described above.

The resist can be disposed (e.g., by spin coating or other techniques known in the art) directly on the monolayer of nanostructures. Alternatively, one or more additional layers can be disposed between the resist and the monolayer. For example, in one class of embodiments, a dielectric layer is disposed on the monolayer of nanostructures, and the resist is disposed on the dielectric layer.

The methods can be used to produce essentially any number of monolayer arrays. For example, when positive resist is used, the unexposed resist can be provided in two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete second regions of the resist layer, such that two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete nanostructure monolayer arrays remain on the first layer. Similarly, when negative resist is used, exposed resist can be provided in two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete first regions of the resist layer, such that a like number of discrete nanostructure monolayer arrays remains on the first layer.

Essentially all of the features noted for the methods above apply to these embodiments as well, as relevant; for example, with respect to composition of the first layer, disposition of the first layer on a substrate, composition of the substrate, incorporation of the array(s) into transistor(s), nanostructure shape and composition, size and density of the array(s), and the like. It is worth noting that the monolayer array (or each of multiple arrays) can comprise an ordered array or a disordered array.

Figure 4:
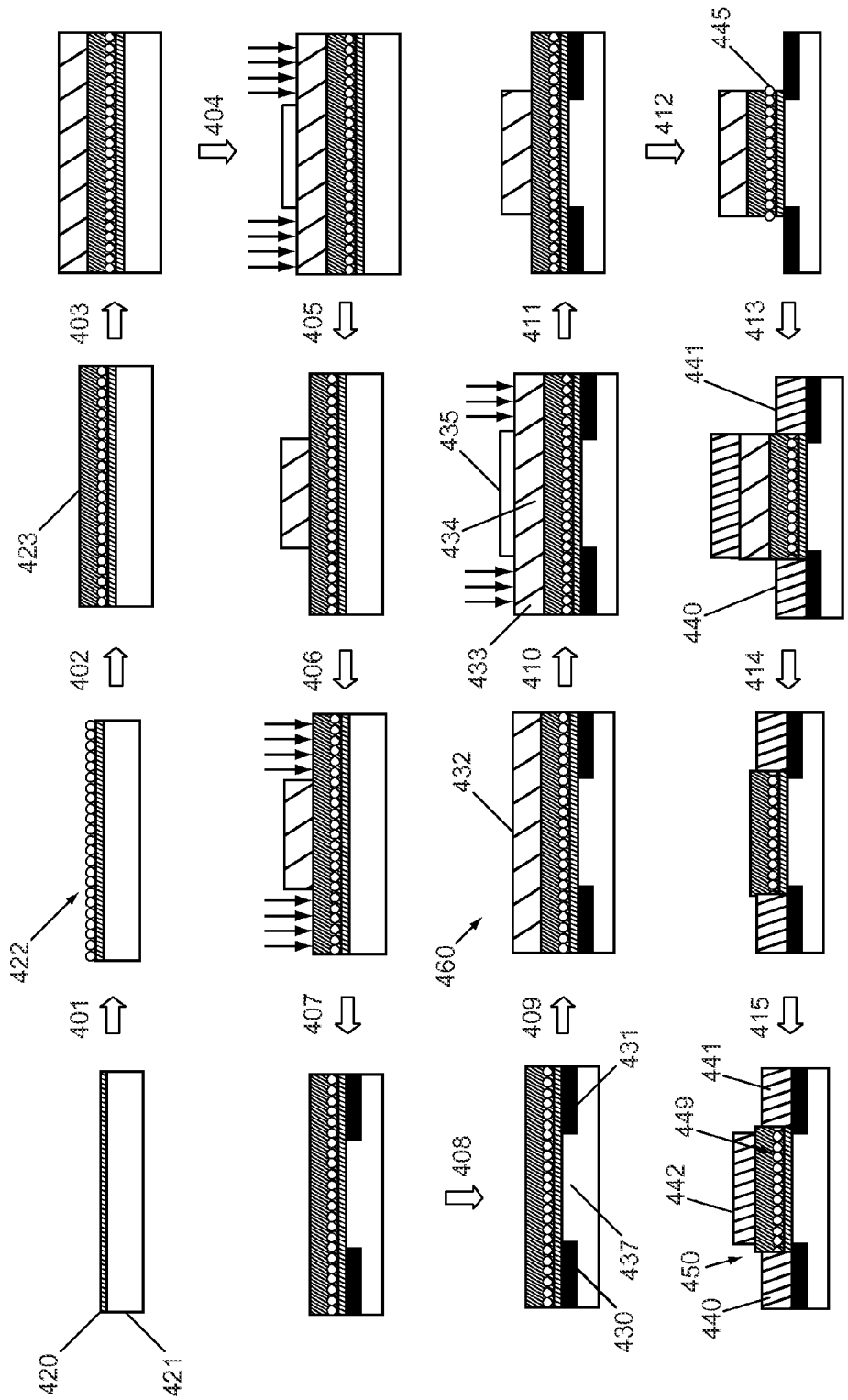
FIG. 4 schematically illustrates fabrication of a flash transistor comprising a monolayer array of nanostructures, including use of resist to pattern the monolayer.

An exemplary embodiment is schematically illustrated in FIG. 4. In this example, first layer 420 (e.g., a 3-4 nm thick layer of $SiO_2$ or another oxide, nitride, or other nonconductive material) is disposed on substrate 421 (e.g., a Si or other semiconductor substrate). In step 401, monolayer 422 of nanostructures (e.g., Pd quantum dots) is disposed on the first layer. In step 402, control dielectric layer 423 (e.g., an oxide such as $SiO_2$ or $Al_2O_3$, an insulating polymer, or another nonconductive material) is disposed on the monolayer. (For example, an $Al_2O_3$ layer can be disposed by atomic layer deposition, or an $SiO_2$ layer can be disposed by chemical vapor deposition.) The control dielectric layer is coated with a positive resist in step 403, masked and exposed in step 404, and developed in step 405 to remove the exposed resist. In steps 406-408, source region 430 and drain region 431, which are separated by channel region 437, are created in substrate 421 by ion implantation (step 406), stripping off the unexposed resist (step 407), and activation (step 408). The control dielectric layer is again coated with positive resist (e.g., polymethyl methacrylate (PMMA)) to form resist layer 432, in step 409. In photolithography step 410, resist in first regions 433 is exposed (e.g., by electron beam or deep UV), while resist in second region 434 is protected by mask 435 and remains unexposed. Exposed resist is removed in step 411 (e.g., developed with an organic solvent), then the portion of the control dielectric layer and first layer and the nanostructures underlying the exposed resist in first region 433 are removed (e.g., by dipping in hydrofluoric acid) in step 412, leaving monolayer array of nanostructures 445. The boundaries of array 445 correspond to those of second region 434, and are therefore defined by those of first region 433. In step 413, a metal layer is disposed to form source electrode 440 and drain electrode 441. In step 414, the unexposed resist is removed without disturbing the control dielectric layer or the nanostructures underlying it (e.g., by contacting the unexposed resist with at least one solvent, e.g., acetone). Gate electrode 442 (e.g., Cr/Au or another suitable material, including, but not limited to, polysilicon, a metal silicide (e.g., nickel silicide or tungsten silicide), ruthenium, or ruthenium oxide) is then disposed on the control dielectric layer in step 415, producing transistor 450.

Another general class of embodiments also provides methods for patterning a nanostructure monolayer. In the methods, a first layer comprising a resist layer disposed thereon is provided. The resist is permitted to remain in at least a first region of the resist layer while the resist is removed from at least a second region of the resist layer. A population of nanostructures is disposed on the resist layer and the first layer; the nanostructures contact the resist in the first region and the first layer in a second region. The resist and its overlying nanostructures are removed from the first region, and any nanostructures which are not in contact with the first layer are removed from the second region, leaving at least one nanostructure monolayer array remaining on the first layer. It will be evident that the position, size, shape, etc. of the array corresponds to that of the second region, and that the number of arrays formed is equal to the number of second regions.

The resist can disposed, exposed, and removed according to lithography techniques well known in the art. Removal of the resist and its overlying nanostructures from the first region and of any nanostructures which are not in contact with the first layer (e.g., in the second region) is optionally accomplished simultaneously, for example, by washing with at least a first solvent.

Essentially all of the features noted for the methods above apply to these embodiments as well, as relevant; for example, with respect to composition of the first layer, coating of the first layer, disposition of the first layer on a substrate, composition of the substrate, incorporation of the array(s) into transistor(s), nanostructure shape and composition, nanostructure ligands, size and density of the array(s), and the like. It is worth noting that the monolayer array (or each of multiple arrays) can comprise an ordered array or a disordered array.

Yet another general class of embodiments also provides methods for patterning a nanostructure monolayer. In the methods, resist and a monolayer of nanostructures embedded in the resist are disposed on a first layer, to provide a resist layer. A predetermined pattern on the resist layer is exposed (e.g., to light, an electron beam, x-rays, etc.), to provide exposed resist in at least a first region of the resist layer and unexposed resist in at least a second region of the resist layer.

If a positive resist is employed, the exposed resist and its embedded nanostructures are removed from the first layer without removing the unexposed resist and its embedded nanostructures. If a negative resist is employed, the unexposed resist and its embedded nanostructures are removed from the first layer without removing the exposed resist and its embedded nanostructures. Whether positive or negative resist is used, at least one nanostructure monolayer array defined by the first region remains on the first layer. It will be evident that if a positive resist is used, the position of the array corresponds to that of the second region (i.e., the inverse of the first region), while if a negative resist is used, the position of the array corresponds to that of the first region. The boundaries of the nanostructure monolayer array are thus defined by the boundaries of the first region.

The resist layer can be formed by essentially any convenient technique. For example, the first layer can be spin coated with a solution comprising the resist and the nanostructures.

The methods can be used to produce essentially any number of monolayer arrays. For example, when positive resist is used, the unexposed resist can be provided in two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete second regions of the resist layer, such that two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete nanostructure monolayer arrays remain on the first layer. Similarly, when negative resist is used, exposed resist can be provided in two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more discrete first regions of the resist layer, such that a like number of discrete nanostructure monolayer arrays remains on the first layer.

Optionally, the resist comprises a silicon compound and the exposed resist silicon oxide (e.g., $SiO_2$). For example, the resist can be a silsesquioxane, such as mercapto-propyl-cyclohexyl polyhedral oligomeric silsesquioxane, hydrogen silsesquioxane, octavinyl dimethyl silyl silsesquioxane, octasilane silsesquioxane, or octavinyl-T8 silsesquioxane. In one class of embodiments, the silsesquioxane or silicate is photopolymerizable. The nanostructures can, but need not, have a silsesquioxane or other ligand such as those noted herein bound to their surface.

Essentially all of the features noted for the methods above apply to these embodiments as well, as relevant; for example, with respect to composition of the first layer, treatment of the first layer, disposition of the first layer on a substrate, composition of the substrate, incorporation of the array(s) into transistor(s), nanostructure shape and composition, size and density of the array(s), and the like. It is worth noting that the monolayer array (or each of multiple arrays) can comprise an ordered array or, typically, a disordered array.

The resist layer optionally includes a compound that increases the dielectric constant of the layer. For example, the resist layer can include a spin-on-dielectric (e.g., a compound such as aluminum i-propoxide, tri-methyl aluminum, tri-ethyl aluminum, hafnium t-butoxide, hafnium ethoxide, tetrabenzyl hafnium, tris(cyclopentadienyl)lanthanum, tris(i-propylcyclopentadienyl)lanthanum, pentakis (dimethylamino)tantalum, tantalum methoxide, or tantalum ethoxide) along with a negative resist (e.g., hydrogen silsesquioxane), such that when the resist is exposed and the spin-on-dielectric is cured, the resulting matrix around the nanostructures has a dielectric constant higher than that of exposed resist without the compound. The nanostructures are optionally adjacent to or in physical or electrical contact with the first layer, or optionally are completely surrounded by the resist. The resist layer can also be utilized as a diffusion barrier, e.g., to prevent the material comprising the nanostructures from diffusing into the first layer or any underlying substrate during a subsequent high temperature processing step. For example, when metal nanostructures on an $SiO_2$ first layer are annealed at elevated temperatures, the metal can diffuse through the $SiO_2$ layer. With a high k dielectric layer in the middle of metal nanostructures and the substrate, the diffusion can be blocked. As just one example, a hafnium oxide-containing resist can help stabilize Ru nanostructures during an annealing step.

Figure 10:
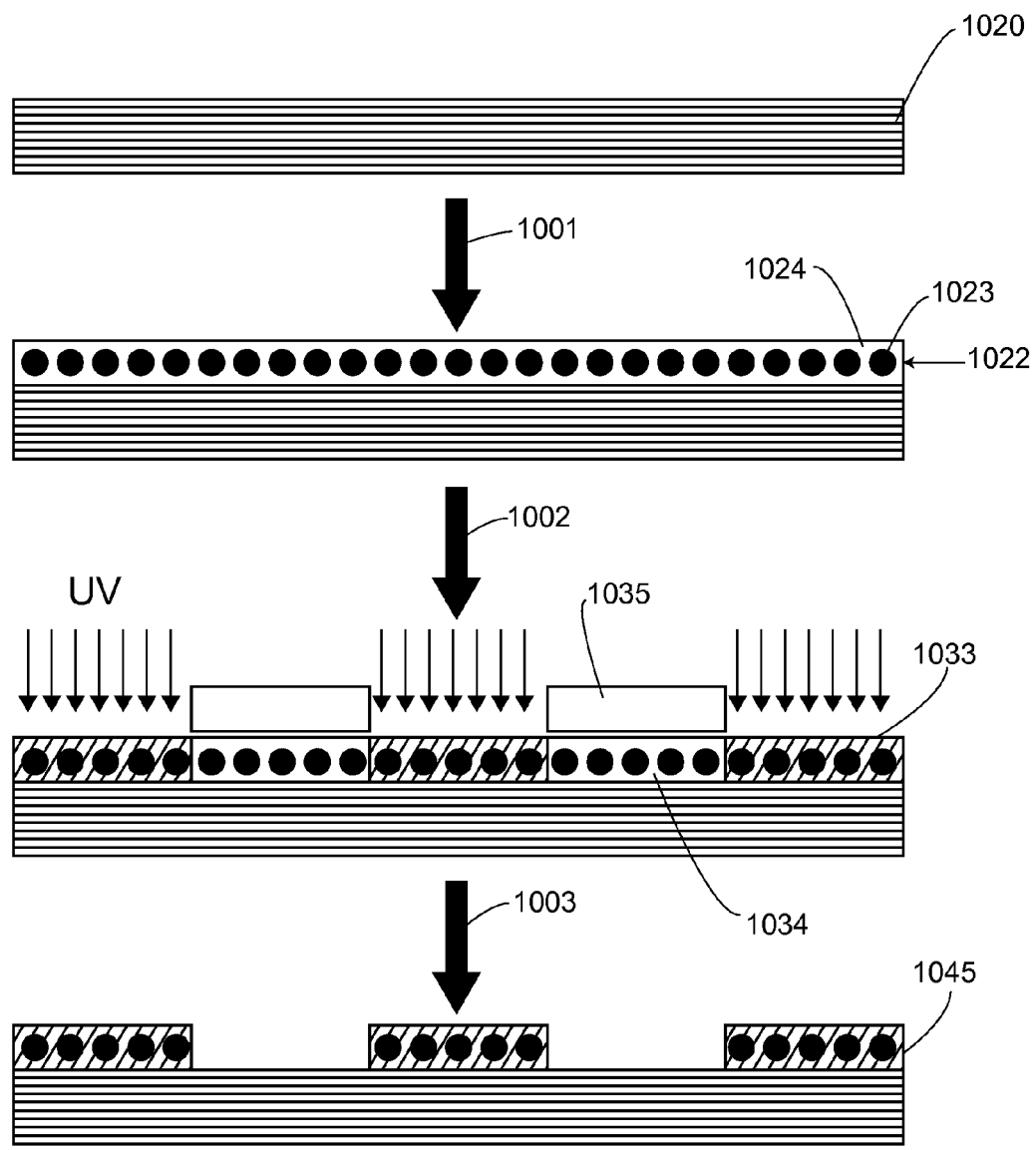
FIG. 10 schematically illustrates patterning of a monolayer array of nanostructures embedded in resist.

An exemplary embodiment is schematically illustrated in FIG. 10. In this example, in step 1001, resist 1024 and nanostructures 1023 are disposed on first layer 1020 to provide resist layer 1022. In step 1002, resist in first regions 1033 is exposed (e.g., by deep UV), while resist in second regions 1034 is protected by mask 1035 and remains unexposed. Unexposed resist with its embedded nanostructures is removed (e.g., developed with an organic solvent) in step 1003, leaving monolayer arrays 1045 of nanostructures embedded in exposed resist.

As noted, devices produced by or useful in practicing the methods of the invention are also a feature of the invention. Thus, another general class of embodiments provides a device comprising a first layer, a monolayer array of nanostructures disposed on the first layer, and resist disposed on the first layer. In one class of embodiments, the resist comprises a resist layer disposed on the monolayer array of nanostructures. See, e.g., device 460 in FIG. 4. In another class of embodiments, the resist occupies a first region of the first layer and the monolayer array of nanostructures occupies a second region of the first layer, adjacent to the first region. In yet another class of embodiments, the monolayer array of nanostructures is embedded in the resist (see, e.g., arrays 1045 in FIG. 10).

Essentially all of the features noted for the methods above apply to these embodiments as well, as relevant; for example, with respect to composition of the first layer, coating of the first layer, disposition of the first layer on a substrate, composition of the substrate, incorporation of the array(s) into transistor(s), nanostructure shape and composition, nanostructure ligands, size and density of the array(s), and the like. It is worth noting that the monolayer array (or each of multiple arrays) can comprise an ordered array or a disordered array.

Devices for Monolayer Formation

One aspect of the invention provides devices and methods of using the devices for forming nanostructure arrays. Thus, one general class of embodiments provides a device comprising a first layer, a second layer, a cavity between the first and second layers, one or more spacers, and at least one aperture. The one or more spacers are positioned between the first and second layers and maintain a distance between the first and second layers. The at least one aperture connects the cavity with an exterior atmosphere. The cavity is occupied by a population of nanostructures.

As will be described in greater detail below, the device can be used to form a nanostructure array. In brief, a solution of nanostructures is introduced into the cavity, and the solvent is evaporated from the cavity. As the solvent evaporates, the nanostructures assemble into an array on the first layer. The speed of evaporation can be controlled and slow, such that the nanostructures assemble into an ordered array.

Thus, in one class of embodiments, the nanostructures are dispersed in at least one solvent, while in other embodiments, the nanostructures are substantially free of solvent. The nanostructures optionally comprise an array disposed on the first layer. The array can comprise a disordered array, but in certain embodiments, the array comprises an ordered array. The array preferably comprises a monolayer, e.g., an ordered monolayer such as a hexagonal-close-packed monolayer, but optionally comprises more than a monolayer.

The first and second layers are typically substantially planar and substantially parallel to each other. Suitable materials for the first layer include, but are not limited to, those described above; for example, a dielectric material such as an oxide (e.g., silicon oxide, hafnium oxide, and alumina) or a nitride. The first layer optionally includes a coating comprising a composition that includes a nanostructure association group. Exemplary coating compositions and nanostructure association groups have been described above.

The first layer can be disposed on a substrate. Exemplary substrates have also been described above; for example, a semiconductor substrate can be used if the resulting array of nanostructures is to be incorporated into a transistor or similar device. It will be evident that multiple devices can be disposed on a single substrate and used to simultaneously produce essentially any desired number and/or size of nanostructure arrays at predetermined positions on the substrate (e.g., two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more arrays).

The second layer and/or the spacer(s) can comprise essentially any suitable material. For example, the second layer and/or the spacer(s) can comprise a metal or a dielectric material (e.g., aluminum, nickel, chromium, molybdenum, ITO, a nitride, or an oxide).

The distance between the first and second layers is greater than an average diameter of the nanostructures. The distance can be about two times the average diameter of the nanostructures or more, although to encourage formation of a monolayer of nanostructures, in certain embodiments, the distance between the first and second layers is less than about two times the average diameter of the nanostructures. For example, for quantum dots having an average diameter of about 3-5 nm, the distance would be less than about 6-10 nm.

The device can be of essentially any desired size and/or shape. In one class of embodiments, the first layer has four edges. The first and second layers are separated by two spacers, which run along two opposite edges of the first layer. Two apertures, which run along the remaining two opposite edges of the first layer, connect the cavity with the exterior atmosphere, e.g., to permit the solvent to escape as it evaporates. It will be evident that a large number of other configurations are possible. As just one additional example, the first layer can have four edges and four corners, with a spacer at each corner and an aperture along each edge, or the device can be circular, irregularly shaped, or the like.

Formation of the nanostructure array can be facilitated by application of an electric field across the cavity (see, e.g., Zhang and Liu (2004) "In situ observation of colloidal monolayer nucleation driven by an alternating electric field" Nature 429:739-743). Thus, in one class of embodiments, the first layer comprises or is disposed on a first conductive material, and the second layer comprises or is disposed on a second conductive material. Conductive materials include, but are not limited to, a metal, a semiconductor, ITO, and the like. Note that the presence of an insulating layer on either or both faces of the cavity (e.g., a dielectric first layer) does not preclude the application of such a field.

The nanostructures can comprise, e.g., short nanorods, substantially spherical nanostructures or quantum dots, and can comprise essentially any desired material. Nanostructures are described in greater detail below in the section entitled "Nanostructures".

Figure 5:
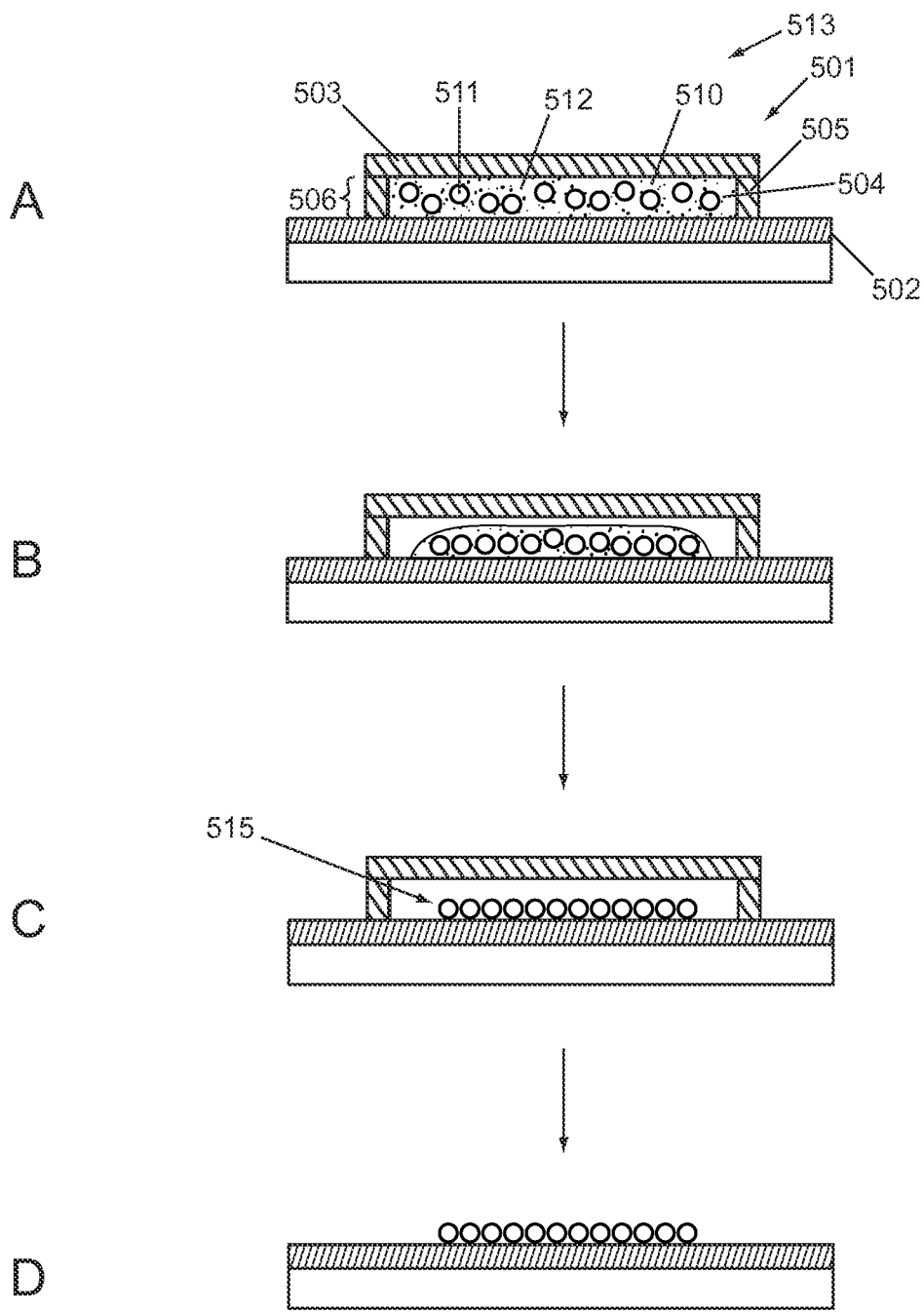
FIG. 5 Panels A-D schematically illustrate formation of a monolayer array of nanostructures using a device of the invention. A side view of the device is schematically depicted in Panels A-C.

An example embodiment is schematically illustrated in FIG. 5, Panels A-C. In this example, device 501 includes first layer 502, second layer 503, cavity 504 between the first and second layers, and two spacers 505. The spacers are positioned between the first and second layers and maintain distance 506 between them. Two apertures 510 connect cavity 504 with external atmosphere 513. The cavity is occupied by a population of nanostructures 511, which in Panels A and B are dispersed in solvent 512, while in Panel C, they comprise array 515 disposed on the first layer.

As noted, methods using devices of the invention form another feature of the invention. Thus, one general class of embodiments provides methods for forming a nanostructure array. In the methods, a device comprising a first layer, a second layer, and a cavity between the first and second layers is provided. A solution comprising nanostructures dispersed in at least one solvent is introduced into the cavity. At least a portion of the solvent is evaporated from the cavity, whereby the nanostructures assemble into an array disposed on the first layer.

An exemplary method is schematically illustrated in FIG. 5, which depicts a cavity comprising nanostructures dispersed in a solvent in Panel A. The nanostructures draw together as the solvent evaporates (Panel B) and assemble into an array on the first layer (Panel C). The second layer is removed (Panel D); in this example, the spacers are also removed, leaving the nanostructure array disposed on the first layer.

The array is optionally incorporated into a device, e.g., a memory device; for example, the nanostructure array can comprise the gate area of a flash transistor. It will be evident that the methods can be used to form essentially any number of nanostructure arrays simultaneously, at predetermined positions (e.g., two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more).

Essentially all of the features noted for the devices above apply to the methods as well, as relevant; for example, with respect to configuration of the device; composition of the first layer and/or spacers; type of nanostructures; configuration of the resulting array; and/or the like.

The device can be fabricated, e.g., using conventional lithographic, MEMS, and/or integrated circuit techniques. In one aspect, providing the device includes disposing a third layer on the first layer, disposing the second layer on the third layer, and removing at least a portion of the third layer, whereby the cavity between the first and second layers is formed. The third layer or portion thereof can be removed, e.g., by etching away the third layer with an etchant, e.g., an anisotropic etchant. For example, the third layer can comprise polysilicon (i.e., polycrystalline silicon), amorphous silicon, molybdenum or titanium, and the etchant can comprise $XeF_2$.

It will be evident that the thickness of the third layer which is removed defines the height of the resulting cavity between the first and second layers. Thus, the third layer has a thickness that is greater than an average diameter of the nanostructures. The third layer can have a thickness of about two times the average diameter of the nanostructures or more, although to encourage formation of a monolayer of nanostructures, in certain embodiments, the third layer has a thickness that is less than about two times the average diameter of the nanostructures.

The first and second layers are typically separated by one or more spacers, which maintain the distance between the first and second layers when the third layer is removed. As noted, the resulting device can be of essentially any size and/or shape, so a large number of configurations for the first, second, and third layers and the spacers are possible. For example, in one class of embodiments, the first layer has four edges. The first and second layers are separated by two spacers, which run along two opposite edges of the first layer. The resulting device thus has two apertures running along the remaining two opposite ages. Alternatively, the device can have more or fewer spacers, spacers at corners instead of edges, can be circular or irregular in shape, and the like.

Figure 6:
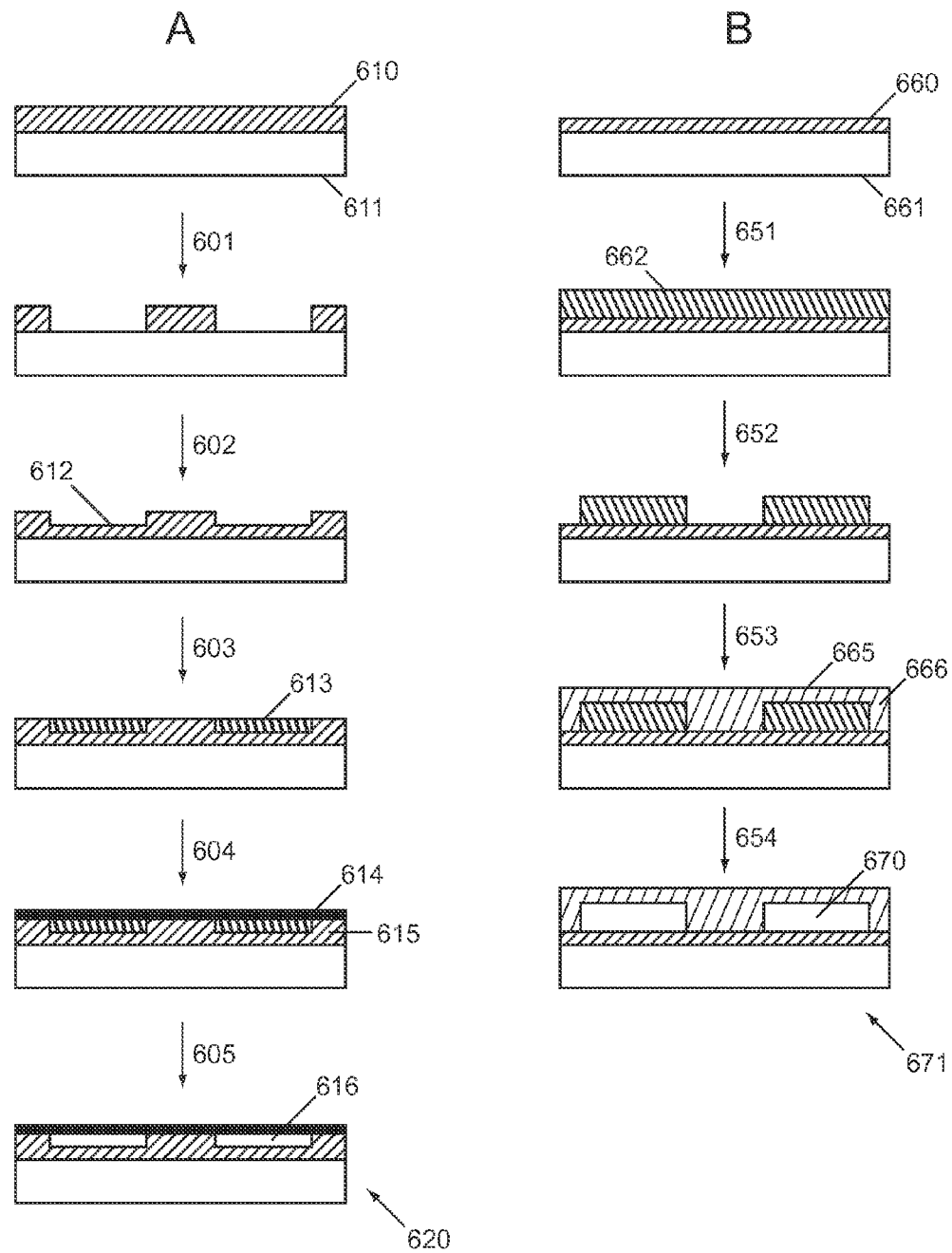
FIG. 6 Panels A-B schematically illustrate fabrication of devices for forming nanostructure arrays. Side views of the devices are shown.

An exemplary method for providing a device is schematically illustrated in FIG. 6 Panel A. In this example, a relatively thick layer 610 comprising, e.g., the same material as the desired first layer (e.g., $SiO_2$ or another dielectric material) disposed on substrate 611 (e.g., a Si or other semiconductor substrate) is provided. In step 601, layer 610 is masked and stripes are etched into it. In step 602, a thin layer of material is disposed to form first layer 612. In step 603, third layer 613 is disposed on first layer 612 (e.g., a polysilicon third layer can be disposed by chemical vapor deposition). In step 604, second layer 614 is disposed on third layer 613 (e.g., a thin metal second layer can be evaporated onto the third layer). The thick, remaining portions of layer 610 comprise spacers 615. In step 605, the third layer is etched away to leave cavities 616 in device 620. In this example, two devices are fabricated simultaneously on the same substrate.

Another exemplary method for providing a device is schematically illustrated in FIG. 6 Panel B. In this example, thin first layer 660 is provided on substrate 661. In step 651, third layer 662 is disposed on first layer 660. In step 652, third layer 662 is masked and stripes are etched in it. In step 653, metal is deposited to form second layer 665 and spacers 666. The device is optionally masked and etched in stripes perpendicular to those previously formed, to provide free edges for an etchant to access the third layer on opposite sides. In step 654, the third layer is etched away to leave cavities 670 in device 671. Again, in this example, two devices are fabricated simultaneously on the same substrate.

The first layer optionally comprises a coating comprising a composition including a nanostructure association group. Thus, the methods optionally include coating the first layer with a composition comprising a nanostructure association group, prior to disposing the third layer on the first layer. Exemplary coating compositions and nanostructure association groups have been described above.

Nanostructures can be conveniently introduced into the cavity by, e.g., capillary action. In one class of embodiments, the solution of nanostructures is introduced into the cavity by immersing the device in an excess of the solution, permitting the solution to be drawn into the cavity by capillary action, and removing the device from the excess of the solution.

Part or substantially all the solvent is evaporated. A rate of evaporation of the solvent can be controlled, e.g., to control array formation. For example, slow evaporation of the solvent gradually increases the concentration of nanostructures, which can be conducive to formation of an ordered array of nanostructures, e.g., an ordered monolayer such as a hexagonal-close-packed monolayer.

The process of solvent evaporation can create lateral motion of the nanostructures, which can contribute to formation of an ordered array. Additional motion of the nanostructures can be encouraged, e.g., by applying an AC voltage across the cavity after introducing the solution into the cavity (e.g., prior to or simultaneous with evaporation of the solvent). See Zhang and Liu (supra), which indicates that an AC voltage can generate eddy currents in the solution that give rise to lateral motion of the nanostructures, contributing to formation of an ordered array (e.g., a hexagonal-close-packed monolayer).

When evaporation and array formation have proceeded as far as desired, the second layer is removed. Optionally, any extraneous nanostructures (e.g., any nanostructures greater than a monolayer) and/or any remaining solvent can also be removed, e.g., by washing. The second layer can, for example, be etched away, or the spacers can be etched away and the second layer lifted off, e.g., by washing with a solvent, without disturbing the nanostructure array. Similarly, a layer of resist can be disposed on the spacers under the second layer, or under the spacers on the first layer, to facilitate lifting off the second layer by soaking in a suitable solvent.

Another general class of embodiments provides a device including a solid support comprising at least one vertical discontinuity on its surface. The discontinuity comprises a protrusion from the surface or an indentation in the surface. The protrusion or indentation is at a predetermined position on the solid support. The device also includes a population of nanostructures disposed on the protrusion or in the indentation.

As will be described in greater detail below, the device can be used to form a nanostructure array. In brief, a solution of nanostructures is deposited on the solid support, and the solvent is evaporated. As the solvent evaporates, the nanostructures assemble into an array on the protrusion or in the indentation. The speed of evaporation can be controlled and slow, such that the nanostructures assemble into an ordered array.

Thus, in one class of embodiments, the nanostructures are dispersed in at least one solvent, while in other embodiments, the nanostructures are substantially free of solvent. The nanostructures optionally comprise an array disposed on the protrusion or in the indentation. The array can comprise a disordered array, but in certain embodiments, the array comprises an ordered array. The array preferably comprises a monolayer, e.g., an ordered monolayer such as a hexagonal-close-packed monolayer, but optionally comprises more than a monolayer.

In a preferred class of embodiments, the solid support comprises a first layer. The solid support optionally also includes a substrate on which the first layer is disposed. In one class of embodiments, the first layer includes a coating comprising a composition comprising a nanostructure association group. Exemplary materials for the first layer and substrate, and exemplary coating compositions and nanostructure association groups, have been described above. Essentially all of the features noted in the embodiments above apply these embodiments as well, as relevant; for example, with respect to type of nanostructures (e.g., short nanorods, substantially spherical nanostructures, quantum dots, or the like).

It will be evident that a single solid support can comprise multiple devices, which can be used to simultaneously produce essentially any desired number and/or size of nanostructure arrays at predetermined positions on the solid support (e.g., on a substrate comprising the support, e.g., two or more, 10 or more, 50 or more, 100 or more, 1000 or more, $1 \times 10^4$ or more, $1 \times 10^6$ or more, $1 \times 10^9$ or more, $1 \times 10^{10}$ or more, $1 \times 10^{11}$ or more, or $1 \times 10^{12}$ or more arrays).

Figure 7:
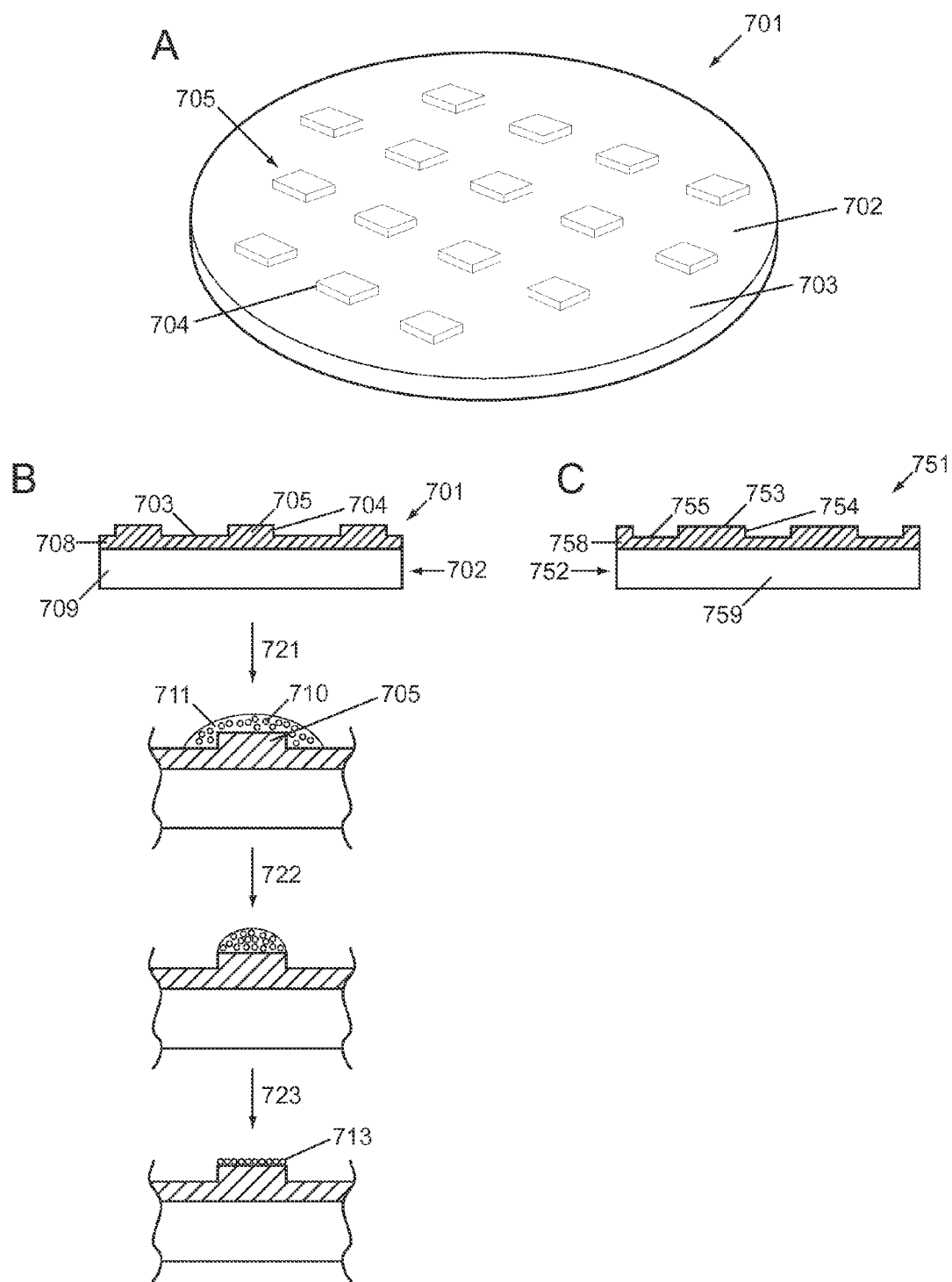
FIG. 7 Panels A-C schematically illustrate exemplary devices of the invention. Panel A depicts a top view of a device. Panel B presents a cross section of the device shown in Panel A, and outlines formation of a monolayer array of nanostructures using the device. Panel C depicts a cross section of another exemplary device.

Exemplary embodiments are schematically illustrated in FIG. 7, Panels Letter A-C. In one example, device 701 comprises solid support 702, which includes first layer 708 and substrate 709. Surface 703 of solid support 702 includes a plurality of vertical discontinuities 704, which comprise protrusions 705 from the surface (Panels A-B). Panel B also illustrates a population of nanostructures 710, dispersed in solvent 711 or in array 713, disposed on protrusions 705. In a second example, device 751 (Panel C) comprises solid support 752, which includes first layer 758 and substrate 759. Surface 753 of solid support 752 includes a plurality of vertical discontinuities 754, which comprise indentations 755 in the surface.

The devices can be fabricated, e.g., using conventional lithographic, MEMS, and/or integrated circuit techniques, e.g., by masking and etching the first layer.

As noted, methods using devices of the invention form another feature of the invention. Thus, one general class of embodiments provides methods for forming a nanostructure array. In the methods, a solid support comprising at least one vertical discontinuity on its surface is provided. The discontinuity comprises a protrusion from the surface or an indentation in the surface, and the protrusion or indentation is at a predetermined position on the solid support. A solution comprising nanostructures dispersed in at least one solvent is deposited on the solid support. At least a portion of the solvent is evaporated, whereby the nanostructures assemble into an array disposed on the protrusion or in the indentation.

An exemplary method is schematically illustrated in FIG. 7 Panel B. In step 721, a solution of nanostructures 710 in solvent 711 is deposited on solid support 702, which includes protrusions 705 from surface 703. As the solvent evaporates, the concentration of nanostructures increases. The solvent eventually de-wets the surface in some areas, clinging to the protrusions and de-wetting in the space between the protrusions. Convection currents within the now-isolated droplets of solvent can provide lateral mobility to the nanostructures, facilitating their self-assembly. Eventually, as evaporation proceeds, solvent surface tension results in a droplet of solvent remaining on top of the protrusion (step 722). Substantially all of the solvent can be evaporated away, or evaporation can be halted once assembly of the nanostructures has reached the desired stage. Removal of any remaining solvent, and optionally of any nanostructures greater than a monolayer and/or any nanostructures left in between the protrusions, leaves array 713 of nanostructures disposed on the protrusion (step 723).

The array is optionally incorporated into a device, e.g., a memory device; for example, the nanostructure array can comprise the gate area of a flash transistor. It will be evident that the methods can be used to form essentially any number of nanostructure arrays simultaneously, at predetermined positions, e.g., two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more arrays.

Essentially all of the features noted for the devices above apply to the methods as well, as relevant; for example, with respect to configuration of the device, type of nanostructures, configuration of the resulting array, and/or the like.

In a preferred class of embodiments, the solid support comprises a first layer. The solid support optionally also includes a substrate on which the first layer is disposed. The first layer optionally comprises a coating comprising a composition including a nanostructure association group. Thus, the methods optionally include coating the first layer with a composition comprising a nanostructure association group, prior to depositing the solution on the first layer. Exemplary materials for the first layer and substrate, and exemplary coating compositions and nanostructure association groups, have been described above.

The solution containing the nanostructures can be deposited on the solid support by any of a variety of techniques, including, for example, spin-coating the solution on the solid support, dip-coating the solution on the solid support, soaking the solid support in an excess of the solution, or spray coating the solid support with the solution.

Part or substantially all the solvent is evaporated. A rate of evaporation of the solvent can be controlled, e.g., to control array formation. For example, slow evaporation of the solvent gradually increases the concentration of nanostructures, which can be conducive to formation of an ordered array of nanostructures, e.g., an ordered monolayer such as a hexagonal-close-packed monolayer.

Devices Including Nanostructure Arrays

The methods and devices described above can be used to produce nanostructure arrays at predetermined positions, and these arrays can be incorporated into devices such as memory devices, LEDs, and the like. Thus, in one aspect, the invention provides devices including nanostructure arrays, including arrays of predetermined location and/or size.

One general class of embodiments provides a device that includes a substrate and two or more nanostructure arrays disposed on the substrate. Each nanostructure array is disposed at a predetermined position on the substrate. As noted, the device is optionally produced by a method of the invention; exemplary devices are schematically illustrated in FIG. 1 (device 101) and FIG. 2 (device 201).

The substrate can comprise essentially any desired material, depending, e.g., on the desired use of the nanostructure arrays. Suitable substrates include, but are not limited to: a semiconductor; a uniform substrate, e.g., a wafer of solid material, such as silicon or other semiconductor material, glass, quartz, polymerics, etc.; a large rigid sheet of solid material, e.g., glass, quartz, plastics such as polycarbonate, polystyrene, etc.; a flexible substrate, such as a roll of plastic such as polyolefin, polyamide, and others; or a transparent substrate. Combinations of these features can be employed. The substrate optionally includes other compositional or structural elements that are part of an ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

The nanostructures can, but need not be, in physical contact with the substrate. Thus, in one class of embodiments, a first layer is disposed between the nanostructure arrays and the substrate. Exemplary materials for the first layer have been described above. The first layer optionally includes a coating comprising a composition including a nanostructure association group; exemplary compositions and nanostructure association groups have likewise been described above.

In one class of embodiments, the first layer comprises a dielectric material and has a thickness of between about 1 nm and about 10 nm, e.g., between 3 and 4 nm. The first layer can serve as a tunnel dielectric layer in embodiments in which the nanostructure arrays are incorporated into flash transistors or memory devices, for example. Thus, in some embodiments, for each monolayer array of nanostructures, the substrate comprises a source region, a drain region, and a channel region between the source and drain regions and underlying the monolayer array of nanostructures; a control dielectric layer is disposed on each monolayer array of nanostructures; and a gate electrode is disposed on each control dielectric layer.

The device can include essentially any number of nanostructure arrays, for example, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more nanostructure arrays. Similarly, the arrays can be of essentially any desired size and/or shape. For example, each nanostructure array can have an area of about $10^4$ μm$^2$ or less, about $10^3$ μm$^2$ or less, about $10^2$ μm$^2$ or less, about 10 μm$^2$ or less, about 1 μm$^2$ or less, about $10^5$ nm$^2$ or less, about $10^4$ nm$^2$ or less, or even about 4225 nm$^2$ or less, about 2025 nm$^2$ or less, about 1225 nm$^2$ or less, about 625 nm$^2$ or less, or about 324 nm$^2$ or less. Each nanostructure array optionally has dimensions of about 45×45 nm or less, about 35×35 nm or less, about 25×25 nm or less, or about 18×18 nm or less.

In one aspect, each nanostructure array comprises an ordered array and/or a monolayer, e.g., a hexagonal-close-packed monolayer. For many applications, however, ordered arrays are not required. For example, for arrays for use in memory devices, the nanostructures need not be ordered in the arrays as long as they achieve sufficient density in disordered arrays. Thus, in another aspect, each nanostructure array comprises a disordered array, e.g., a disordered monolayer array. The nanostructure arrays (e.g., disordered monolayer arrays) are optionally embedded in a solid form of a spin-on-dielectric or a solid form of a spin-on-glass.

In one class of embodiments, the arrays have a high density of nanostructures. For example, each nanostructure array optionally has a density greater than about $1\times10^{10}$ nanostructures/cm$^2$, greater than about $1\times10^{11}$ nanostructures/cm$^2$, greater than about $1\times10^{12}$ nanostructures/cm$^2$, or even greater than about $1\times10^{13}$ nanostructures/cm$^2$.

It will be evident that essentially any of the features described herein apply in any relevant combination; for example, a device having two or more disordered monolayer arrays, each with a density of greater than about $1\times10^{11}$ nanostructures/cm$^2$, disposed at predetermined positions on a substrate is a feature of the invention.

In one class of embodiments, the nanostructures comprise substantially spherical nanostructures or quantum dots. The nanostructures can comprise essentially any desired material, chosen, e.g., based on the desired application. For example, the nanostructures can comprise a conductive material, a nonconductive material, a semiconductor, and/or the like. In one aspect, the nanostructures comprising the arrays have a work function of about 4.5 eV or higher. Such nanostructures are useful, for example, in fabrication of memory devices, where if the work function of the nanostructures is not sufficiently high, electrons stored in the nanostructures tend to travel back across the tunnel dielectric layer, resulting in memory loss. Thus, the nanostructures (e.g., the substantially spherical nanostructures or quantum dots) optionally comprise materials such as palladium (Pd), iridium (Ir), nickel (Ni), platinum (Pt), gold (Au), ruthenium (Ru), cobalt (Co), tungsten (W), tellurium (Te), iron platinum alloy (FePt), or the like. The nanostructures comprising the arrays are typically preformed, that is, synthesized prior to their incorporation in the array. For example, in one aspect, the nanostructures are colloidal nanostructures. In one class of embodiments, each of the nanostructures comprising the arrays comprises a coating comprising a ligand associated with a surface of the nanostructure, e.g., a silsesquioxane ligand such as those described in U.S. Provisional Patent Application Ser. No. 60/632,570 (supra) or illustrated in FIG. 3. In a related class of embodiments, the nanostructures comprising the arrays are encompassed by SiO$_2$ or other insulating shells, produced, e.g., from a silsesquioxane coating (see U.S. Provisional Patent Application Ser. No. 60/632,570). Such ligands or shells optionally control spacing between adjacent nanostructures in the arrays. Nanostructures are described in greater detail below in the section entitled "Nanostructures".

Use of nanostructures as storage elements in memory devices facilitates creation of nodes smaller than those accessible by conventional integrated circuit fabrication techniques. Thus, another general class of embodiments provides a memory device that includes at least one transistor (e.g., a MOSFET) comprising a gate area which is occupied by a monolayer array of nanostructures and which has an area of 8100 nm$^2$ or less. The gate area optionally has an area of about 4225 nm$^2$ or less, about 2025 nm$^2$ or less, about 1225 nm$^2$ or less, about 625 nm$^2$ or less, or even about 324 nm$^2$ or less. The gate area optionally has dimensions of about 65×65 nm or less, about 45×45 nm or less, about 35×35 nm or less, about 25×25 nm or less, or about 18×18 nm or less.

The device can include essentially any number of such transistors. For example, the memory device can include two or more, 10 or more, 50 or more, 100 or more, 1000 or more, $1\times10^4$ or more, $1\times10^6$ or more, $1\times10^9$ or more, $1\times10^{10}$ or more, $1\times10^{11}$ or more, or $1\times10^{12}$ or more transistors.

Essentially all of the features noted for the embodiments above apply to this embodiment as well, as relevant. For example, the nanostructures comprising the monolayer array optionally comprise substantially spherical nanostructures or quantum dots, have a work function of about 4.5 eV or higher, are preformed (e.g., colloidal), and/or are encompassed by SiO$_2$ or other insulating shells. Similarly, the monolayer array can comprise an ordered array (e.g., a hexagonal-close-packed monolayer) or a disordered array. The monolayer array (whether ordered or disordered) optionally has a density greater than about $1\times10^{10}$ nanostructures/cm$^2$, greater than about $1\times10^{11}$ nanostructures/cm$^2$, greater than about $1\times10^{12}$ nanostructures/cm$^2$, or greater than about $1\times10^{13}$ nanostructures/cm$^2$.

One exemplary embodiment is schematically illustrated in FIG. 4, in which memory device/transistor 450 includes monolayer array 445 of nanostructures occupying gate area 449.

Additional details of nanostructure-based memory devices, transistors, and the like can be found, e.g., in Duan et al. U.S. patent application Ser. No. 11/018,572, filed Dec. 21, 2004.

Nanostructures

The individual nanostructures employed in the methods and devices include, but are not limited to, a nanocrystal, a quantum dot, a nanodot, a nanoparticle, a nanowire, a nanorod, a nanotube, a nanotetrapod, a tripod, a bipod, a branched nanocrystal, or a branched tetrapod. In one aspect, the methods and devices include spherical, nearly spherical, and/or isotropic nanocrystals such as nanodots and/or quantum dots, e.g., substantially spherical nanocrystals or quantum dots having an average diameter less than about 10 nm, and optionally less than about 8 nm, 6 nm, 5 nm, or 4 nm.

The nanostructures employed in the methods and devices of the present invention can be fabricated from essentially any convenient materials. For example, the nanocrystals can comprise inorganic materials, e.g., a metal, including, e.g., Pd, Ir, Ni, Pt, Au, Ru, Co, W, Te, Ag, Ti, Sn, Zn, Fe, FePt, or the like, or a semiconducting material selected from a variety of Group II-VI, Group III-V, or Group IV semiconductors, and including, e.g., a material comprising a first element selected from Group II of the periodic table and a second element selected from Group VI (e.g., ZnS, ZnO, ZnSe, ZnTe, CdS, CdSe, CdTe, HgS, HgSe, HgTe, MgS, MgSe, MgTe, CaS, CaSe, CaTe, SrS, SrSe, SrTe, BaS, BaSe, BaTe, and like materials);

a material comprising a first element selected from Group III and a second element selected from Group V (e.g., GaN, GaP, GaAs, GaSb, InN, InP, InAs, InSb, and like materials); a material comprising a Group IV element (Ge, Si, and like materials); a material such as PbS, PbSe, PbTe, AlS, AlP, and AlSb; or an alloy or a mixture thereof. The nanostructures can include a p- or n-doped semiconductor. In other embodiments, the nanostructures can include an insulating material (e.g., a metal oxide), a polymer, an organic material (e.g., carbon), and/or the like.

In one aspect, the nanostructures are preformed, i.e., fabricated prior to their use in the methods or incorporation into the devices. For example, the nanostructures can be colloidal nanostructures. Synthesis of colloidal metal nanostructures (e.g., Pd, Pt, and Ni nanostructures) is described in Whiteford et al. U.S. Provisional Patent Application Ser. No. 60/637,409, filed Dec. 16, 2004. Synthesis of colloidal III-V semiconductor nanostructures is described in Scher et al. U.S. Provisional Patent Application Ser. No. 60/628,455, filed Nov. 15, 2004. Additional details of nanostructure synthesis have been described in the literature (see, e.g., the following references).

Nanostructures can be fabricated and their size can be controlled by any of a number of convenient methods that can be adapted to different materials. For example, synthesis of nanocrystals of various composition is described in, e.g., Peng et al. "Shape control of CdSe nanocrystals," Nature 404, 59-61 (2000); Puntes et al. "Colloidal nanocrystal shape and size control: The case of cobalt," Science 291, 2115-2117 (2001); Alivisatos et al. U.S. Pat. No. 6,306,736; Alivisatos et al. U.S. Pat. No. 6,225,198; Alivisatos et al. U.S. Pat. No. 5,505,928; Alivisatos et al. U.S. Pat. No. 5,751,018; Gallagher et al. U.S. Pat. No. 6,048,616; and Weiss et al. U.S. Pat. No. 5,990,479.

Growth of nanowires having various aspect ratios, including nanowires with controlled diameters, is described in, e.g., Gudiksen et al "Diameter-selective synthesis of semiconductor nanowires," J. Am. Chem. Soc. 122, 8801-8802 (2000); Cui et al. "Diameter-controlled synthesis of single-crystal silicon nanowires," Appl. Phys. Lett. 78, 2214-2216 (2001); Gudiksen et al. "Synthetic control of the diameter and length of single crystal semiconductor nanowires," J. Phys. Chem. B 105, 4062-4064 (2001); Morales et al. "A laser ablation method for the synthesis of crystalline semiconductor nanowires," Science 279, 208-211 (1998); Duan et al. "General synthesis of compound semiconductor nanowires," Adv. Mater. 12, 298-302 (2000); Cui et al. "Doping and electrical transport in silicon nanowires," J. Phys. Chem. B 104, 5213-5216 (2000); Peng et al. "Shape control of CdSe nanocrystals," Nature 404, 59-61 (2000); Puntes et al. "Colloidal nanocrystal shape and size control: The case of cobalt," Science 291, 2115-2117 (2001); Alivisatos et al. U.S. Pat. No. 6,306,736; Alivisatos et al. U.S. Pat. No. 6,225,198; Lieber et al. U.S. Pat. No. 6,036,774; Lieber et al. U.S. Pat. No. 5,897,945; Lieber et al. U.S. Pat. No. 5,997,832; Urbau et al. "Synthesis of single-crystalline perovskite nanowires composed of barium titanate and strontium titanate," J. Am. Chem. Soc., 124, 1186 (2002); and Yun et al. "Ferroelectric Properties of Individual Barium Titanate Nanowires Investigated by Scanned Probe Microscopy," Nanoletters 2, 447 (2002).

Growth of branched nanowires (e.g., nanotetrapods, tripods, bipods, and branched tetrapods) is described in, e.g., Jun et al. "Controlled synthesis of multi-armed CdS nanorod architectures using monosurfactant system," J. Am. Chem. Soc. 123, 5150-5151 (2001); and Manna et al. "Synthesis of Soluble and Processable Rod-, Arrow-, Teardrop-, and Tetrapod-Shaped CdSe Nanocrystals," J. Am. Chem. Soc. 122, 12700-12706 (2000).

Synthesis of nanoparticles is described in, e.g., Clark Jr. et al. U.S. Pat. No. 5,690,807; El-Shall, et al. U.S. Pat. No. 6,136,156; Ying et al. U.S. Pat. No. 6,413,489; and Liu et al. "Sol-Gel Synthesis of Free-Standing Ferroelectric Lead Zirconate Titanate Nanoparticles," J. Am. Chem. Soc. 123, 4344 (2001).

The nanostructures optionally comprise a core-shell architecture. Synthesis of core-shell nanostructure heterostructures, namely nanocrystal and nanowire (e.g., nanorod) core-shell heterostructures, are described in, e.g., Peng et al. "Epitaxial growth of highly luminescent CdSe/CdS core/shell nanocrystals with photostability and electronic accessibility," J. Am. Chem. Soc. 119, 7019-7029 (1997); Dabbousi et al. "(CdSe)ZnS core-shell quantum dots: Synthesis and characterization of a size series of highly luminescent nanocrysallites," J. Phys. Chem. B 101, 9463-9475 (1997); Manna et al. "Epitaxial growth and photochemical annealing of graded CdS/ZnS shells on colloidal CdSe nanorods," J. Am. Chem. Soc. 124, 7136-7145 (2002); and Cao et al. "Growth and properties of semiconductor core/shell nanocrystals with InAs cores," J. Am. Chem. Soc. 122, 9692-9702 (2000). Similar approaches can be applied to growth of other core-shell nanostructures.

Growth of nanowire heterostructures in which the different materials are distributed at different locations along the long axis of the nanowire is described in, e.g., Gudiksen et al. "Growth of nanowire superlattice structures for nanoscale photonics and electronics," Nature 415, 617-620 (2002); Bjork et al. "One-dimensional steeplechase for electrons realized," Nano Letters 2, 86-90 (2002); Wu et al. "Block-by-block growth of single-crystalline Si/SiGe superlattice nanowires," Nano Letters 2, 83-86 (2002); and Empedocles U.S. Provisional Patent Application Ser. No. 60/370,095. Similar approaches can be applied to growth of other heterostructures.

In certain embodiments, the collection or population of nanostructures is substantially monodisperse in size and/or shape. See, e.g., Bawendi et al. U.S. Pat. No. 6,576,291.

Silsesquioxane and other ligand coatings for nanostructures, $SiO_2$ shells, and oxidation of metal nanostructures are described in U.S. Patent Application Ser. Nos. 60/632,570 (supra), 11/147,670, and 11/299,299.

While the foregoing invention has been described in some detail for purposes of clarity and understanding, it will be clear to one skilled in the art from a reading of this disclosure that various changes in form and detail can be made without departing from the true scope of the invention. For example, all the techniques and apparatus described above can be used in various combinations. All publications, patents, patent applications, and/or other documents cited in this application are incorporated by reference in their entirety for all purposes to the same extent as if each individual publication, patent, patent application, and/or other document were individually indicated to be incorporated by reference for all purposes.

The invention claimed is:

1. A method for forming a nanostructure array, the method comprising:
   providing a first layer;
   providing nanostructures dispersed in a solution comprising a liquid form of a spin-on-dielectric that comprises a photopolymerizable compound, and wherein the nanostructures comprise a silsesquioxane ligand coating;
   disposing the solution on the first layer, whereby the nanostructures form a monolayer array on the first layer; and curing the liquid form of the spin-on-dielectric to provide a solid form of the spin-on-dielectric.

2. The method of claim 1, wherein the first layer comprises: (a) a dielectric material, (b) silicon oxide coated with hexamethyldisilizane, or (c) silicon nitride coated with hexamethyldisilizane.

3. The method of claim 1, wherein the first layer is disposed on a semiconductor substrate.

4. The method of claim 3, wherein the substrate comprises a source region, a drain region, and a channel region between the source and drain regions and underlying the monolayer array of nanostructures, and wherein the method further comprises disposing a gate electrode on the solid form of the spin-on-dielectric.

5. The method of claim 4, the method comprising disposing a dielectric layer on the solid form of the spin-on-dielectric prior to disposing the gate electrode on the solid form of the spin-on-dielectric.

6. The method of claim 1, wherein the solid form of the spin-on-dielectric comprises silicon oxide.

7. The method of claim 1, wherein the liquid form of the spin-on-dielectric comprises a silsesquioxane that is mercapto-propyl-cyclohexyl polyhedral oligomeric silsesquioxane, hydrogen silsesquioxane, octavinyl dimethyl silyl silsesquioxane, octasilane silsesquioxane, or octavinyl-T8 silsesquioxane.

8. The method of claim 1, further comprising:
exposing at least a first region of the first layer and the solution disposed thereon to light of an appropriate wavelength, thereby curing the spin-on-dielectric in the first region, while simultaneously protecting at least a second region of the first layer and the solution disposed thereon from the light, whereby the spin-on-dielectric in the second region remains uncured; and
removing the uncured spin-on-dielectric and the nanostructures therein from the first layer without removing the cured spin-on-dielectric and the nanostructures therein.

9. The method of claim 8, wherein exposing at least a first region of the first layer and the solution disposed thereon to the light comprises exposing 10 or more, 50 or more, 100 or more, 1000 or more, $1\times10^4$ or more, $1\times10^6$ or more, $1\times10^9$ or more, or $1\times10^{12}$ or more discrete regions.

10. The method of claim 1, wherein the monolayer array of nanostructures comprises a disordered array.

11. The method of claim 1, wherein the monolayer array of nanostructures has a density greater than about $1\times10^{10}$ nanostructures/cm$^2$, greater than about $1\times10^{11}$ nanostructures/cm$^2$, greater than about $1\times10^{12}$ nanostructures/cm$^2$, or greater than about $1\times10^{13}$ nanostructures/cm$^2$.

12. The method of claim 1, wherein variation in density of the nanostructures in the monolayer array is less than 10% across the monolayer.

13. The method of claim 1, wherein the nanostructures comprise substantially spherical nanostructures or quantum dots.

14. The method of claim 1, wherein the nanostructures have a work function of about 4.5 eV or higher.

15. The method of claim 1, wherein the nanostructures comprise palladium, nickel, or ruthenium.

16. The method of claim 1, wherein the nanostructures in the monolayer array are randomly distributed as a matrix in the solid form of the spin-on-dielectric.

17. The method of claim 1, wherein the first layer comprises a material selected from the group consisting of: an oxide and a nitride.

18. The method of claim 1, wherein the first layer comprises a material selected from the group consisting of: silicon oxide, silicon nitride, hafnium oxide, and alumina.

19. A method for forming a nanostructure array, the method comprising:
providing a first layer;
providing nanostructures dispersed in a solution comprising a liquid form of a spin-on-dielectric that comprises a photoresist, wherein each of the nanostructures comprises a silsesquioxane ligand associated with a surface of the nanostructure;
disposing the solution on the first layer, whereby the nanostructures form a monolayer array on the first layer; and
curing the liquid form of the spin-on-dielectric to provide a solid form of the spin-on-dielectric.

20. The method of claim 19, wherein the first layer comprises a dielectric material.

21. The method of claim 20, wherein the first layer comprises silicon oxide coated with hexamethyldisilizane, or wherein the first layer comprises silicon nitride coated with hexamethyldisilizane.

22. The method of claim 19, wherein the first layer is disposed on a semiconductor substrate.

23. The method of claim 22, wherein the first layer comprises a dielectric material and has a thickness of between about 1 nm and about 10 nm.

24. The method of claim 23, wherein the substrate comprises a source region, a drain region, and a channel region between the source and drain regions and underlying the monolayer array of nanostructures, and wherein the method further comprises disposing a gate electrode on the solid form of the spin-on-dielectric.

25. The method of claim 24, the method comprising disposing a dielectric layer on the solid form of the spin-on-dielectric prior to disposing the gate electrode on the solid form of the spin-on-dielectric.

26. The method of claim 19, wherein disposing the solution on the first layer comprises spin coating the first layer with the solution.

27. The method of claim 19, wherein the liquid form of the spin-on-dielectric comprises aluminum i-propoxide, tri-methyl aluminum, tri-ethyl aluminum, hafnium t-butoxide, hafnium ethoxide, tetrabenzyl hafnium, tris(cyclopentadienyl)lanthanum, tris(i-propylcyclopentadienyl)lanthanum, pentakis(dimethylamino)tantalum, tantalum methoxide, or tantalum ethoxide.

28. The method of claim 19, wherein the liquid form of the spin-on-dielectric is a liquid form of a spin-on-glass, and wherein the solid form of the spin-on-dielectric is a solid form of a spin-on-glass.

29. The method of claim 19, comprising:
exposing at least a first region of the first layer and the solution disposed thereon to light of an appropriate wavelength, thereby curing the spin-on-dielectric in the first region, while simultaneously protecting at least a second region of the first layer and the solution disposed thereon from the light, whereby the spin-on-dielectric in the second region remains uncured; and
removing the uncured spin-on-dielectric and the nanostructures therein from the first layer without removing the cured spin-on-dielectric and the nanostructures therein.

30. The method of claim 29, wherein exposing at least a first region of the first layer and the solution disposed thereon to the light comprises exposing 10 or more, 50 or more, 100 or more, 1000 or more, $1\times10^4$ or more, $1\times10^6$ or more, $1\times10^9$ or more, or $1\times10^{12}$ or more discrete regions.

31. The method of claim 19, wherein the monolayer array of nanostructures comprises a disordered array.

32. The method of claim 19, wherein the monolayer array of nanostructures has a density greater than about $1\times10^{10}$ nanostructures/cm$^2$, greater than about $1\times10^{11}$ nanostructures/cm$^2$, greater than about $1\times10^{12}$ nanostructures/cm$^2$, or greater than about $1\times10^{13}$ nanostructures/cm$^2$.

33. The method of claim 19, wherein variation in density of the nanostructures in the monolayer array is less than 10% across the monolayer.

34. The method of claim 19, wherein the nanostructures comprise substantially spherical nanostructures or quantum dots.

35. The method of claim 19, wherein the nanostructures have a work function of about 4.5 eV or higher.

36. The method of claim 19, wherein the nanostructures comprise palladium, nickel, or ruthenium.

37. The method of claim 19, wherein the nanostructures in the monolayer array are randomly distributed as a matrix in the solid form of the spin-on-dielectric.

38. The method of claim 19, wherein the first layer comprises a material selected from the group consisting of: an oxide and a nitride.

39. The method of claim 19, wherein the first layer comprises a material selected from the group consisting of: silicon oxide, silicon nitride, hafnium oxide, and alumina.

\* \* \* \* \*